(12) United States Patent
Okuhata

(10) Patent No.: US 10,912,235 B2
(45) Date of Patent: Feb. 2, 2021

(54) MOTOR

(71) Applicant: NIDEC TOSOK CORPORATION, Kanagawa (JP)

(72) Inventor: Yoshihisa Okuhata, Kanagawa (JP)

(73) Assignee: NIDEC TOSOK CORPORATION, Kanagawa (JP)

(*) Notice: Subject to any disclaimer, the term of this patent is extended or adjusted under 35 U.S.C. 154(b) by 0 days.

(21) Appl. No.: 16/355,872

(22) Filed: Mar. 18, 2019

(65) Prior Publication Data

US 2019/0297751 A1 Sep. 26, 2019

(30) Foreign Application Priority Data

Mar. 23, 2018 (JP) .................................. 2018-056141

(51) Int. Cl.
| | |
|---|---|
| H02K 11/30 | (2016.01) |
| H05K 7/20 | (2006.01) |
| H02K 11/33 | (2016.01) |
| H02M 3/158 | (2006.01) |

(52) U.S. Cl.
CPC ......... *H05K 7/20927* (2013.01); *H02K 11/33* (2016.01); *H02M 3/1582* (2013.01)

(58) Field of Classification Search
CPC .......... H02K 5/20; H02K 11/00; H02K 11/33; H02K 7/00; H02K 7/006; H02K 11/0094; H02K 9/19; B60K 1/04; B60K 1/00; B60K 2001/006; B60K 2001/003; B60K 11/02; B60K 2001/001; B60Y 2410/10; B60Y 2400/61
See application file for complete search history.

(56) References Cited

U.S. PATENT DOCUMENTS

| | | | | |
|---|---|---|---|---|
| 2008/0180000 | A1* | 7/2008 | Ward | B60L 50/16 310/68 R |
| 2010/0072865 | A1* | 3/2010 | Endo | B60W 20/00 310/68 D |
| 2012/0262881 | A1* | 10/2012 | Onimaru | B60L 53/14 361/701 |
| 2013/0241458 | A1* | 9/2013 | Soma | H02K 11/33 318/495 |
| 2014/0191624 | A1* | 7/2014 | Jahshan | H02K 1/27 310/68 B |

FOREIGN PATENT DOCUMENTS

JP 2011217557 10/2011

* cited by examiner

*Primary Examiner* — Naishadh N Desai
(74) *Attorney, Agent, or Firm* — JCIPRNET

(57) ABSTRACT

A motor includes a rotor having a motor shaft along a central axis extending in an axial direction; a stator facing the rotor with a gap interposed therebetween in a radial direction; a motor driving inverter unit supplying electric power from a battery to the stator; a charger having a charger inverter unit for charging the battery; and a housing accommodating the stator, the motor driving inverter unit and the charger. The housing has a cooling flow path through which a coolant flows, an inlet port into which the coolant flowing in the cooling flow path flows, and an outlet port from which the coolant flowing in the cooling flow path flows. The motor driving and the charger inverter units are in the housing along the cooling flow path. The motor driving inverter unit is closer to the inlet port side a position where the charger inverter unit is disposed.

19 Claims, 12 Drawing Sheets

MOTOR

CROSS REFERENCE TO RELATED APPLICATIONS

This application claims the priority benefit of Japanese Patent Application No. 2018-056141, filed on Mar. 23, 2018. The entirety of the above-mentioned patent application is hereby incorporated by reference herein and made a part of this specification.

BACKGROUND

Technical Field

The disclosure relates to a motor.

Description of Related Art

In recent years, an increase in efficiency and output of motors has been required. In order to realize an increase in efficiency and output of a motor, it is necessary to cause a high current to flow and to perform control for optimizing timings. In a case in which the motor is driven with a high current in this manner, it is not possible to ignore the influence of heat generated by the motor and components related to driving of the motor. Since the components related to driving of the motor include a motor that includes a switching element that generates a large amount of heat, in particular, it is important to efficiently cool the components.

Meanwhile, Patent Document 1 (Japanese Laid-open No. 2011-217557) discloses a technology for improving the efficiency of a cooling pump by cooling only necessary devices with priority in accordance with an operation mode of a vehicle provided with an electric motor.

In addition, respective components in the motor and components related to driving of the motor tend to increase in size with the requirement for an increase in efficiency and output of the motor. Thus, it is intended to reduce the overall size of the device according to positions at which respective components are disposed and the like.

However, in Patent Document 1, size reduction of the device is not taken into consideration and a disposition of each component suitable for realizing the requirements for efficient cooling and size reduction of the device is not taken into consideration, although there is description regarding cooling of each component.

SUMMARY

The embodiments of the disclosure provide a motor characterized by the disposition of respective components.

According to an embodiment, there is provided a motor including: a rotor that has a motor shaft disposed along a central axis extending in an axial direction; a stator that faces the rotor with a gap interposed therebetween in a radial direction; a motor driving inverter unit that supplies electric power from a battery to the stator; a charger that has a charger inverter unit that charges the battery; and a housing that accommodates the stator, the motor driving inverter unit, and the charger. The housing has a cooling flow path through which a coolant flows, an inlet port into which coolant flowing in the cooling flow path flows, and an outlet port from which the coolant flowing in the cooling flow path flows. The motor driving inverter unit and the charger inverter unit are disposed in the housing along the cooling flow path. The motor driving inverter is disposed closer to a side of the inlet port than a position where the charger inverter unit is disposed.

According to the exemplary embodiments, it is possible to provide a motor characterized by disposition of each component.

DESCRIPTION OF THE EMBODIMENTS

Hereinafter, a motor according to the embodiments of the disclosure will be described with reference to drawings. Although a motor that drives a traction motor for causing a vehicle to travel will be described in the embodiments, the disclosure is not limited thereto and can be applied to any motor. Also, the size, the numbers, and the like of structures in the following drawings may differ from those in the actual structure to allow easy understanding of the components.

Figure 1:
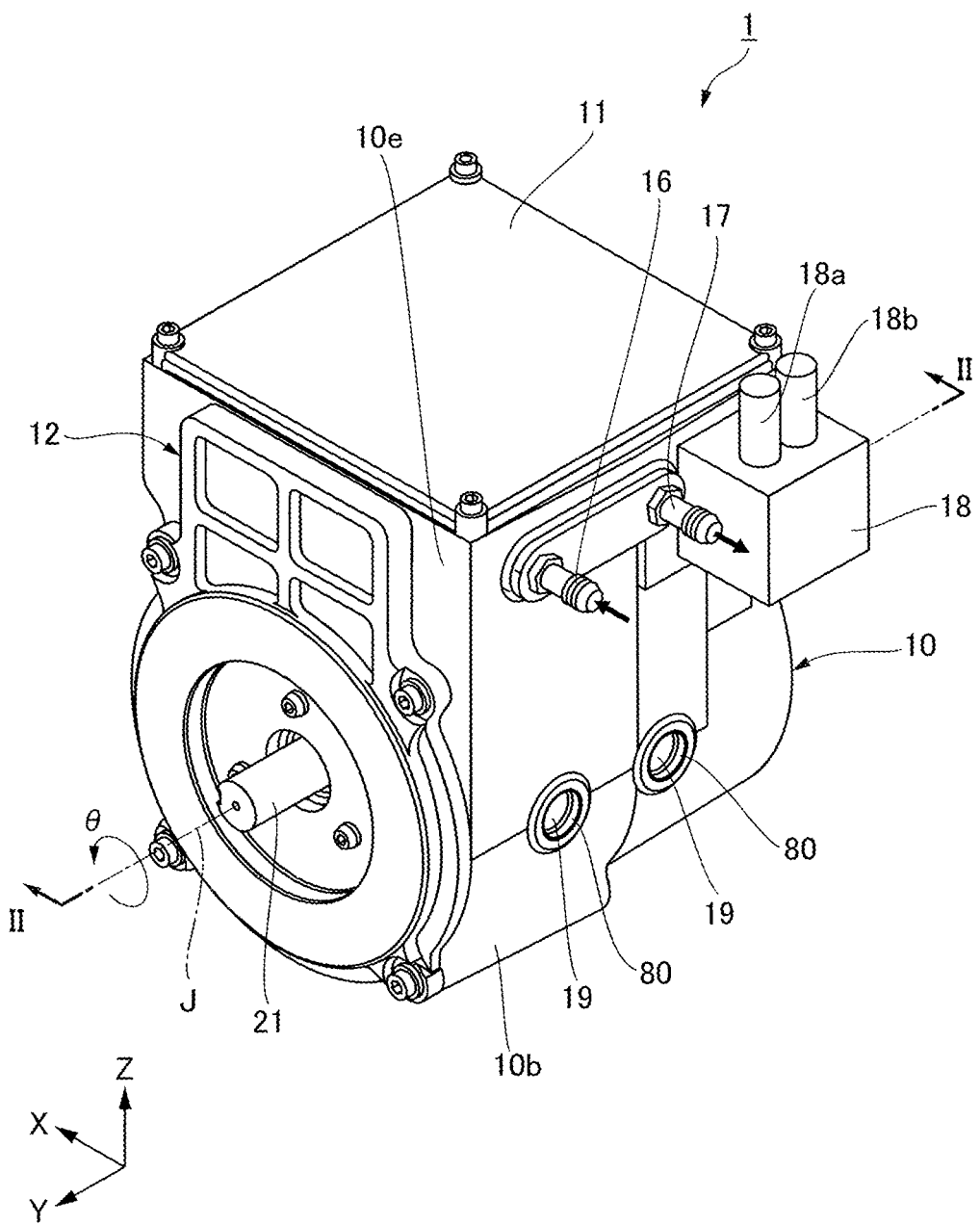
FIG. 1 is a perspective view of a motor according to a first embodiment of the disclosure.

Also, an XYZ coordinate system will appropriately be illustrated as a three-dimensional orthogonal coordinate system in the drawings. In the XYZ coordinate system, the Z-axis direction is a vertical direction Z, with a positive side on the upper side and a negative side on the lower side as illustrated in FIG. 1. Also, the positive side in the vertical direction Z will be referred to as "one side in the vertical direction", and the negative side in the vertical direction Z will be referred to as "the other side in the vertical direction". The Y-axis direction is a direction that is parallel to a central axis J extending in the one direction illustrated in FIG. 1 and is a direction that is perpendicular to the vertical direction Z. In the following description, the direction that is parallel to the central axis J, that is, the Y-axis direction will be referred to as an "axial direction Y". Also, the positive side in the axial direction Y will be referred to as "one side in the axial direction", and the negative side in the axial direction Y will be referred to as "the other side in the axial direction". The X-axis direction is a direction that is perpendicular to both the axial direction Y and the vertical direction Z. In the following description, the X-axis direction will be referred to as a "width direction X". Also, the positive side in the width direction X will be referred to as "one side in the width direction", and the negative side in the width direction X will be referred to as "the other side in the width direction". In the embodiment, the vertical direction Z corresponds to a predetermined direction.

In addition, a radial direction around the central axis J will simply be referred to as a "radial direction", and a circumferential direction around the central axis J will simply be referred to as a "circumferential direction θ". Also, a side in the circumferential direction θ of advancing in the clockwise direction when seen from the other side in the axial direction toward the one side in the axial direction, that is, the side on which the arrow indicating the circumferential direction θ advances in the drawing will be referred to as "one side in the circumferential direction", and the side advancing in the counterclockwise direction, that is, the side opposite to the side in which the arrow indicating the circumferential direction θ in the drawing advances will be referred to as "the other side in the circumferential direction".

Note that the upper side and the lower side in the vertical direction are merely names for describing relative positional relationships between the respective parts, and actual disposition relationships and the like may be disposition relationships other than the disposition relationships and the like represented with these names. In addition, orientations such as front, back, left, right, up, and down in the specification indicate orientations when seen in the drawing and are not intended to limit orientations when the device according to the embodiments of the disclosure is used.

Note that a component extending in the X-axis direction, the Y-axis direction, or the Z-axis direction includes a case in which the component extends in a direction that is inclined within a range of less than 45° relative to the X-axis direction, the Y-axis direction, or the Z-axis direction in addition to a case in which the component extends exactly in the X-axis direction, the Y-axis direction, or the Z-axis direction in the specification.

First Embodiment

<Overall Configuration>

Figure 2:
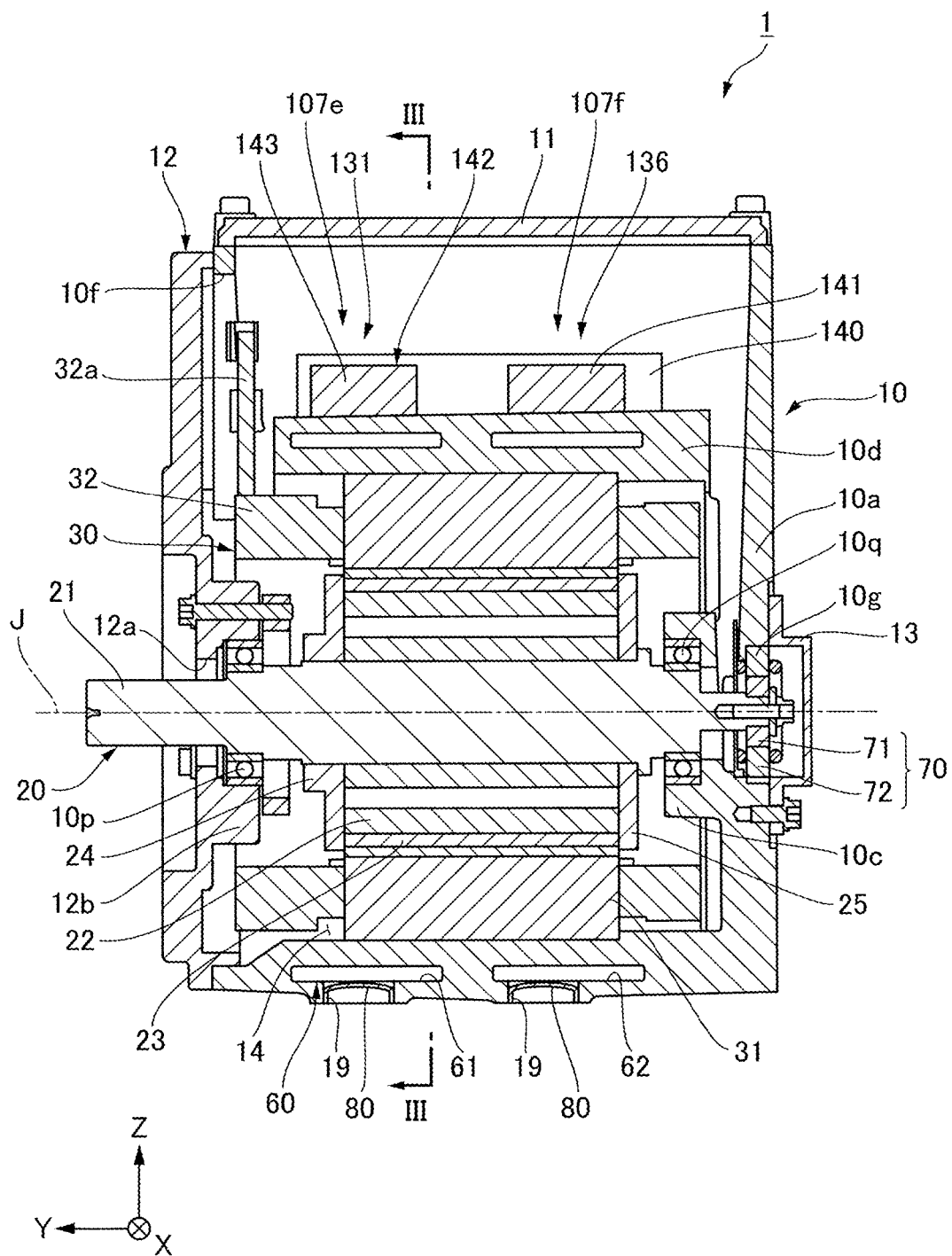
FIG. 2 is a sectional view of a motor 1 corresponding to the view along the arrow II-II in FIG. 1.

FIG. 1 is a perspective view of a motor according to a first embodiment. FIG. 2 is a sectional view of a motor 1 corresponding to the view along the arrow II-II in FIG. 1. As illustrated in FIGS. 1 and 2, the motor 1 according to the embodiment has a housing 10, a lid 11, a cover member 12, a sensor cover 13, a rotor 20 that has a motor shaft 21 disposed along the central axis J, a stator 30, a motor driving device 131, a charger 136, a rotation detection unit 70, and a connector unit 18.

<Housing 10>

As illustrated in FIG. 2, the housing 10 accommodates the rotor 20, the stator 30, the rotation detection unit 70, the motor driving device 131, and the charger 136. The housing 10 is a single member. The housing 10 is produced through sand mold casting, for example. The housing 10 has a peripheral wall 10b, a bottom wall 10a, a bearing holding unit 10c, and a rectangular tubular unit 10e.

<Peripheral Wall 10b>

The peripheral wall 10b has a tubular shape that surrounds the rotor 20 and the stator 30 outside the rotor 20 and the stator 30 in the radial direction. The peripheral wall 10b has a cylindrical shape around the central axis J in the embodiment. The peripheral wall 10b is open on the one side in the axial direction. The peripheral wall 10b has a cooling unit 60 that cools the stator 30, the motor driving device 131, and the charger 136. The cooling unit 60 is a cooling flow path through which a coolant flows.

<Bottom Wall 10a>

The bottom wall 10a is provided at an end of the peripheral wall 10b on the other side in the axial direction. The bottom wall 10a closes the peripheral wall 10b on the other side in the axial direction. The bottom wall 10a has a sensor accommodation unit 10g that penetrates through the bottom wall 10a in the Y-axis direction. The sensor accommodation unit 10g has for example, a circular shape about the central axis J as viewing in the Y-axis direction. The bottom wall 10a and the peripheral wall 10b form the stator accommodation unit 14. That is, the housing 10 has a stator accommodation unit 14 with a tubular shape having a bottom, in which the stator accommodation unit 14 has the peripheral wall 10b and the bottom wall 10a.

<Bearing Holding Unit 10c>

The bearing holding unit 10c has a tubular shape that projects from a peripheral edge of the sensor accommodation unit 10g on a surface of the bottom wall 10a on the one side in the axial direction to the one side in the axial direction. The bearing holding unit 10c holds a bearing 10q that rotatably supports the motor shaft 21 using the central axis J as a rotation axis at a position closer to the other side in the axial direction than a rotor core 22, which will be described later.

<Rectangular Tubular Unit 10e>

The rectangular tubular unit 10e has a rectangular tubular shape extending upwardly from the peripheral wall 10b. The rectangular tubular unit 10e is open on the upper side. In the embodiment, the rectangular tubular unit 10e has a square tubular shape, for example. As illustrated in FIG. 2, a wall of the rectangular tubular unit 10e on the other side in the axial direction among the walls that form the rectangular tubular unit 10e continues to an upper end of the bottom wall 10a. The rectangular tubular unit 10e has a through-hole 10f that penetrates through the wall of the rectangular tubular unit 10e on the one side in the axial direction among the walls that form the rectangular tubular unit 10e in the axial direction Y. A lower end of the through-hole 10f continues to the opening in the peripheral wall 10b on the one side in the axial direction. The rectangular tubular unit 10e and the peripheral wall 10b form the inverter accommodation unit 107e. That is, the housing 10 has the inverter accommodation unit 107e. Also, the rectangular tubular unit 10e and the peripheral wall 10b form the charger accommodation unit 107f. That is, the housing 10 has the charger accommodation unit 107f No partition is provided between the inverter accommodation unit 107e and the charger accommodation unit 107f.

<Inverter Accommodation Unit 107e>

The inverter accommodation unit 107e is positioned outside the stator accommodation unit 14 in the radial direction. In the embodiment, the inverter accommodation unit 107e is positioned on the upper side of the stator accommodation unit 14 in the vertical direction Z that is perpendicular to the axial direction Y. The stator accommodation unit 14 and the inverter accommodation unit 107e are partitioned with the partitioning wall 10d in the vertical direction z. The partitioning wall 10d is a portion on the upper side of the peripheral wall 10b. That is, the peripheral wall 10b has a partitioning wall 10d that partitions the stator accommodation unit 14 and the inverter accommodation unit 107e. The inverter accommodation unit 107e accommodates the motor driving device 131. Note that the end of the peripheral wall 10b on the other side in the circumferential direction indicates a location that continues to an end of the partitioning wall 10d on the one side in the width direction. In addition, the end of the peripheral wall 10b on the one side in the circumferential direction indicates a location that continues to an end of the partitioning wall 10d on the other side in the width direction.

<Charger Accommodation Unit 107f>

The charger accommodation unit 107f is positioned outside the stator accommodation unit 14 in the radial direction. In the embodiment, the charger accommodation unit 107f is positioned on the upper side of the stator accommodation unit 14 in the vertical direction Z that is perpendicular to the axial direction Y. The stator accommodation unit 14 and the charger accommodation unit 107f are partitioned with the partitioning wall 10d in the vertical direction. The partitioning wall 10d is a portion on the upper side of the peripheral wall 10b. That is, the peripheral wall 10b has a partitioning wall 10d that partitions the stator accommodation unit 14 and the charger accommodation unit 107f. The charger accommodation unit 107f accommodates the charger 136.

<Lid 11>

The lid 11 has a plate shape with a plate surface that is perpendicular to the vertical direction Z. The lid 11 is fixed to an upper end of the rectangular tubular unit 10e. The lid 11 blocks opening of the rectangular tubular unit 10e on the upper side.

<Cover Member 12>

The cover member 12 has a plate shape with a plate surface that is perpendicular to the axial direction Y. The cover member 12 is fixed to the surfaces of the peripheral wall 10b and the rectangular tubular unit 10e on the one side in the axial direction. The cover member 12 blocks the opening and the through-hole 10f in the peripheral wall 10b on one side in the axial direction. The cover member 12 has an output shaft hole 12a that penetrates through the cover member 12 in the axial direction Y. The output shaft hole 12a has a circular shape passing through the center axis J, for example. The cover member 12 has a bearing holding unit 12b that projects to the other side in the axial direction from a peripheral edge of the output shaft hole 12a in a surface of the cover member 12 on the other side in the axial direction. The bearing holding unit 12b holds a bearing 10p that supports the motor shaft 21 at a position closer to the one side in the axial direction than the rotor core 22.

<Sensor Cover 13>

The sensor cover 13 is fixed to the surface of the bottom wall 10a on the other side in the axial direction. The sensor cover 13 covers and blocks the opening in the sensor accommodation unit 10g on the other side in the axial direction. The sensor cover 13 covers the rotation detection unit 70 on the other side in the axial direction.

<Rotor 20>

The rotor 20 has a motor shaft 21, a rotor core 22, a magnet 23, a first end plate 24, and a second end plate 25.

<Motor Shaft 21>

The motor shaft 21 is rotatably supported at portions on opposite sides in the axial direction with bearings. The end of the motor shaft 21 on the one side in the axial direction projects from the opening in the peripheral wall 10b on the one side in the axial direction toward the one side in the axial direction. The end of the motor shaft 21 on the one side in the axial direction passes through the output shaft hole 12a and projects to the one side in the axial direction more than the cover member 12. The end of the motor shaft 21 on the other side in the axial direction is inserted into the sensor accommodation unit 10g.

<Rotor Core 22>

The rotor core 22 is fixed to the outer peripheral surface of the motor shaft 21.

<Magnet 23>

The magnet 23 is inserted into a hole that is provided in the rotor core 22 such that the hole penetrates through the rotor core 22 in the axial direction Y.

<First End Plate 24 and Second End Plate 25>

The first end plate 24 and the second end plate 25 have annular plate shapes widening in the radial direction. The first end plate 24 and the second end plate 25 sandwich the rotor core 22 therebetween in the axial direction Y in a state in which the first end plate 24 and the second end plate 25 are in contact with the rotor core 22. The first end plate 24 and the second end plate 25 press the magnet 23 inserted into the hole in the rotor core 22 from opposite sides in the axial direction.

<Stator 30>

The stator 30 faces the rotor 20 with a gap interposed therebetween in the radial direction. The stator 30 has a stator core 31 and a plurality of coils 32 attached to the stator core 31. The stator core 31 has an annular shape around the central axis J. An outer peripheral surface of the stator core 31 is fixed to an inner peripheral surface of the peripheral wall 10b. The stator core 31 faces the rotor core 22 with a gap interposed therebetween on the outer side in the radial direction.

<Rotation Detection Unit 70>

The rotation detection unit 70 detects rotation of the rotor 20. In the embodiment, the rotation detection unit 70 is a variable reluctance (VR)-type resolver, for example. As illustrated in FIG. 2, the rotation detection unit 70 is accommodated in the sensor accommodation unit 10g. That is, the rotation detection unit 70 is disposed at the bottom wall 10a. The rotation detection unit 70 has a resolver rotor 71 and a resolver stator 72.

The resolver rotor 71 has an annular shape extending in the circumferential direction θ. The resolver rotor 71 is fitted and fixed to the motor shaft 21. The resolver rotor 71 is a magnetic member. The resolver stator 72 has an annular shape surrounding the resolver rotor 71 on the outer side in the radial direction. The resolver stator 72 is fitted and fixed to the sensor accommodation unit 10g. The resolver stator 72 is supported by the sensor cover 13 on the other side in the axial direction. That is, the sensor cover 13 supports the rotation detection unit 70 on the other side in the axial direction. The resolver stator 72 has a plurality of coils in the circumferential direction θ.

An inductive voltage in accordance with the position of the resolver rotor 71 in the circumferential direction is generated in the coils of the resolver stator 72 by the resolver rotor 71 rotating along with the motor shaft 21. The resolver stator 72 detects rotation of the resolver rotor 71 by detecting the inductive voltage. In this manner, the rotation detection unit 70 detects rotation of the motor shaft 21 and detects rotation of the rotor 20. Rotation information of the rotor 20 detected by the rotation detection unit 70 is sent to the motor driving device 131 via a sensor wiring (not illustrated).

<Connector Unit 18>

As illustrated in FIG. 1, the connector unit 18 is provided in a surface of the rectangular tubular unit 10e on the other side in the width direction. The connector unit 18 has a first terminal 18a to which a battery 805 (see FIG. 6) is connected and a second terminal 18b to which an external power source 900 (see FIG. 6) is connected. The charger 136 accommodated in the charger accommodation unit 107f of the motor 1 charges the battery 805 connected to a first terminal 18a using the external power source 900 connected to a second terminal 18b. In addition, the motor driving device 131 accommodated in the inverter accommodation unit 107e of the motor 1 uses the battery 805 connected to the first terminal 18a as a power source and supplies electric power to the stator 30. Note that illustration of the wiring that connects each component is omitted.

<Inverter Accommodation Unit 107e and Charger Accommodation Unit 107f>

Figure 3:
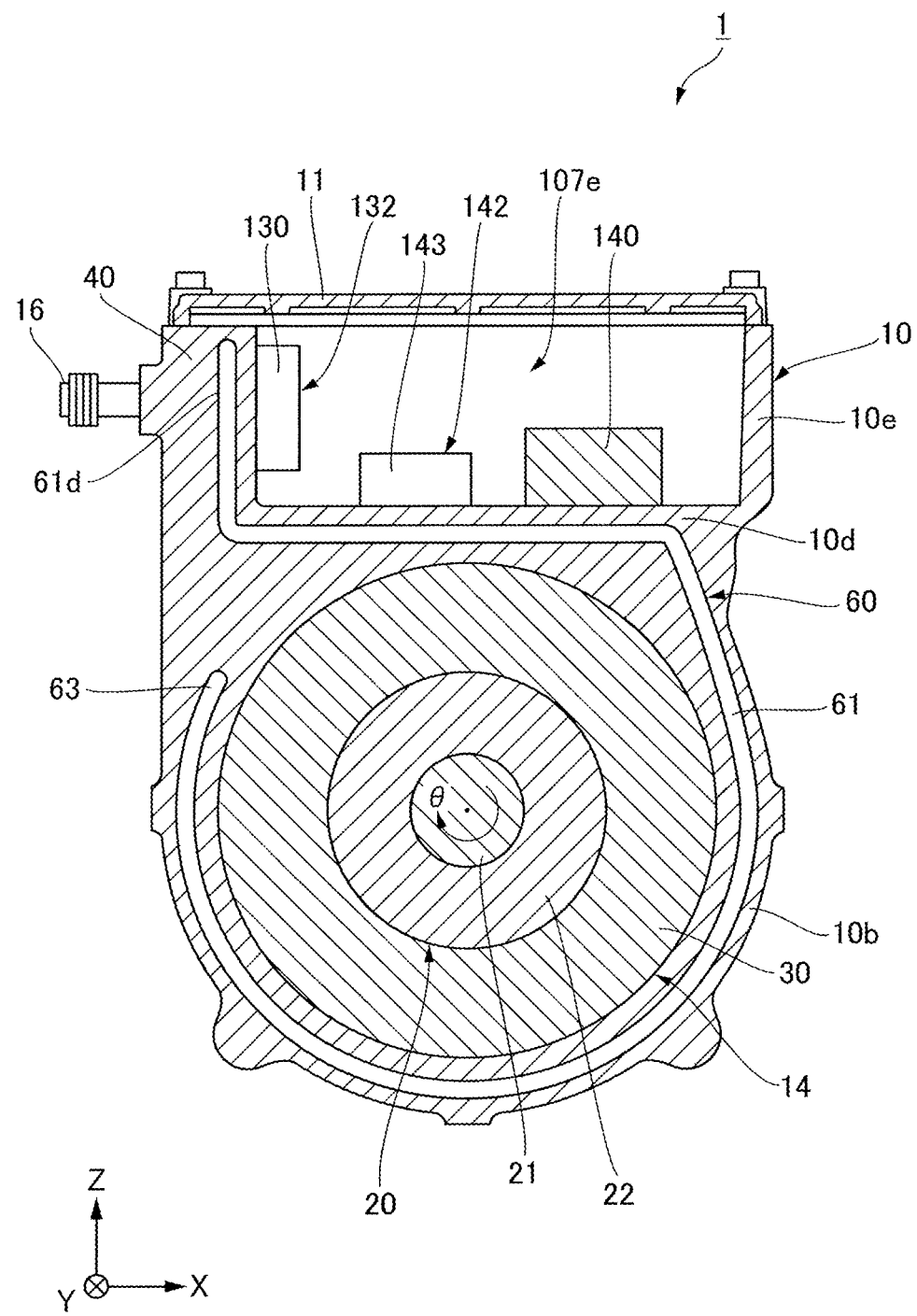
FIG. 3 is a sectional view of the motor 1 corresponding to the view along the arrow III-III in FIG. 2.
Figure 4:
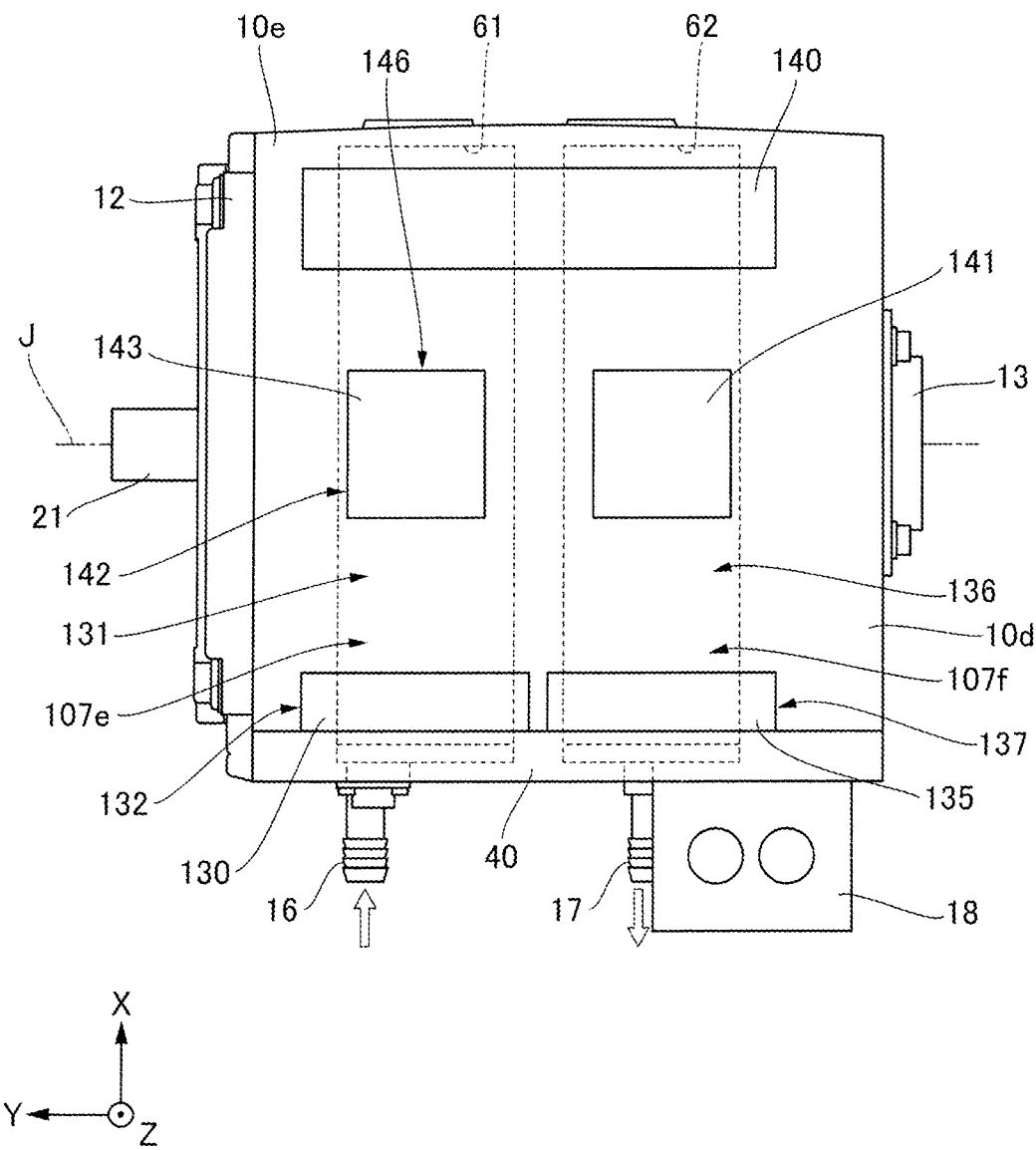
FIG. 4 is a plan view of the motor 1 in FIG. 1 from the top with a lid 11 removed therefrom.

FIG. 3 is a sectional view of the motor 1 corresponding to the view along the arrow III-III in FIG. 2. FIG. 4 is a plan view of the motor 1 in FIG. 1 from the top with the lid 11 removed therefrom. As illustrated in FIGS. 3 and 4, the inverter accommodation unit 107e and the charger accommodation unit 107f are provided such that the inverter accommodation unit 107e and the charger accommodation unit 107f are surrounded by the rectangular tubular unit 10e on the upper surface (the surface on the one side in the vertical direction) of the partitioning wall 10d. As illustrated in FIG. 4, the reactor 140, the condenser 141, and the DC-DC conversion inverter unit 142 are disposed on the upper surface of the partitioning wall 10d (the surface on the one side in the vertical direction). Here, walls that are parallel to the axial direction Y and on the other side in the width direction among the walls of the rectangular tubular unit 10e extending to the one side in the vertical direction from the partitioning wall 10d will be referred to as side walls 40. The motor driving inverter unit 132 of the motor driving device 131 is disposed on the one side in the axial direction among the surfaces of the side walls 40 on the one side in the width direction. The charger inverter unit 137 of the charger 136 is disposed on the other side in the axial direction among the surfaces of the side walls 40 on the one side in the width direction. The wall on which the motor driving inverter unit 132 is disposed among the side walls 40 will be referred to as a first side wall. The wall on which the charger driving inverter unit 137 is disposed among the side walls 40 will be referred to as a second side wall. The first side wall and the second side wall are single members. The upper surface of the partitioning wall 10d is a surface on the outer side in the radial direction among the surfaces of the partitioning wall 10d. The surface of the side wall 40 on the one side in the width direction is a surface on the inner side in the radial direction.

<Motor Driving Device 131>

As illustrated in FIG. 4, the motor driving device 131 is accommodated in the inverter accommodation unit 107e. The motor driving device 131 has a motor driving inverter unit 132 that supplies electric power from the battery 805 to the stator 30. The motor driving inverter unit 132 has a circuit board, which is not illustrated in the drawing, and a motor driving heat generation element 130 that generates heat. The motor driving heat generation element 130 has a configuration that a plurality of switching elements is accommodated in a case body, for example. Each of the plurality of switching elements of the motor driving heat generation element 130 is an insulating gate bipolar transistor (IGBT), for example. The motor driving heat generation element 130 may include other switching elements such as FETs. The motor driving heat generation element 130 may be a single switching element. The motor driving heat generation element 130 may be a heat generation element other than a switching element. The motor driving inverter unit 132 performs DC/AC conversion through switching control of the motor driving heat generation element 130.

<Charger 136>

As illustrated in FIG. 4, the charger 136 is accommodated in the charger accommodation unit 107f. The charger 136 has a charger inverter unit 137 that charges the battery 805 using the external power source 900 as a power source. The charger inverter unit 137 has a circuit board, which is not illustrated in the drawing, and a charger heat generation element 135 that generates heat. The charger heat generation element 135 has a configuration that a plurality of switching elements is accommodated in a case body, for example. Each of the plurality of switching elements of the charger heat generation element 135 is an insulating gate bipolar transistor (IGBT), for example. The charger heat generation element 135 may include other switching elements such as FETs. The charger heat generation element 135 may be a single switching element. The charger heat generation element 135 may be a heat generation element other than a switching element. The charger inverter unit 137 performs AC/DC conversion through switching control of the charger heat generation element 135.

<DC-DC Conversion Unit 146>

The DC-DC conversion unit 146 boosts and lowers a voltage between the motor driving inverter unit 132 and the battery 805, for example. The DC-DC conversion inverter unit 142 performs DC/AC conversion using the DC-DC conversion unit 146. Description regarding a component that performs AC/DC conversion after the DC/AC conversion using the DC-DC conversion inverter unit 142 will be omitted. The DC-DC conversion inverter unit 142 has a circuit board, which is not illustrated in the drawing, and a DC-DC conversion heat generation element 143 that generates heat. The DC-DC conversion heat generation element 143 has a configuration that a plurality of switching elements is accommodated in a case body, for example. Each of the plurality of switching elements of the DC-DC conversion heat generation element 143 is an insulating gate bipolar transistor (IGBT), for example. The DC-DC conversion heat generation element 143 may include other switching elements such as FETs. The DC-DC conversion heat generation element 143 may be a single switching element. The DC-DC conversion heat generation element 143 may be a heat generation element other than a switching element. The DC-DC conversion inverter unit 142 performs DC/AC conversion through switching control of the DC-DC conversion heat generation element 143.

<Reactor 140 and Condenser 141>

The reactor 140 and the condenser 141 performs an improvement in a power factor, stabilization of a voltage, and the like for components including the motor driving device 131, the charger 136, and the DC-DC conversion inverter unit 142. The reactor 140 smooths a voltage connected to the battery 805, for example. The condenser 141 smooths a voltage connected to the battery 805.

<Cooling Unit 60>

Figure 5:
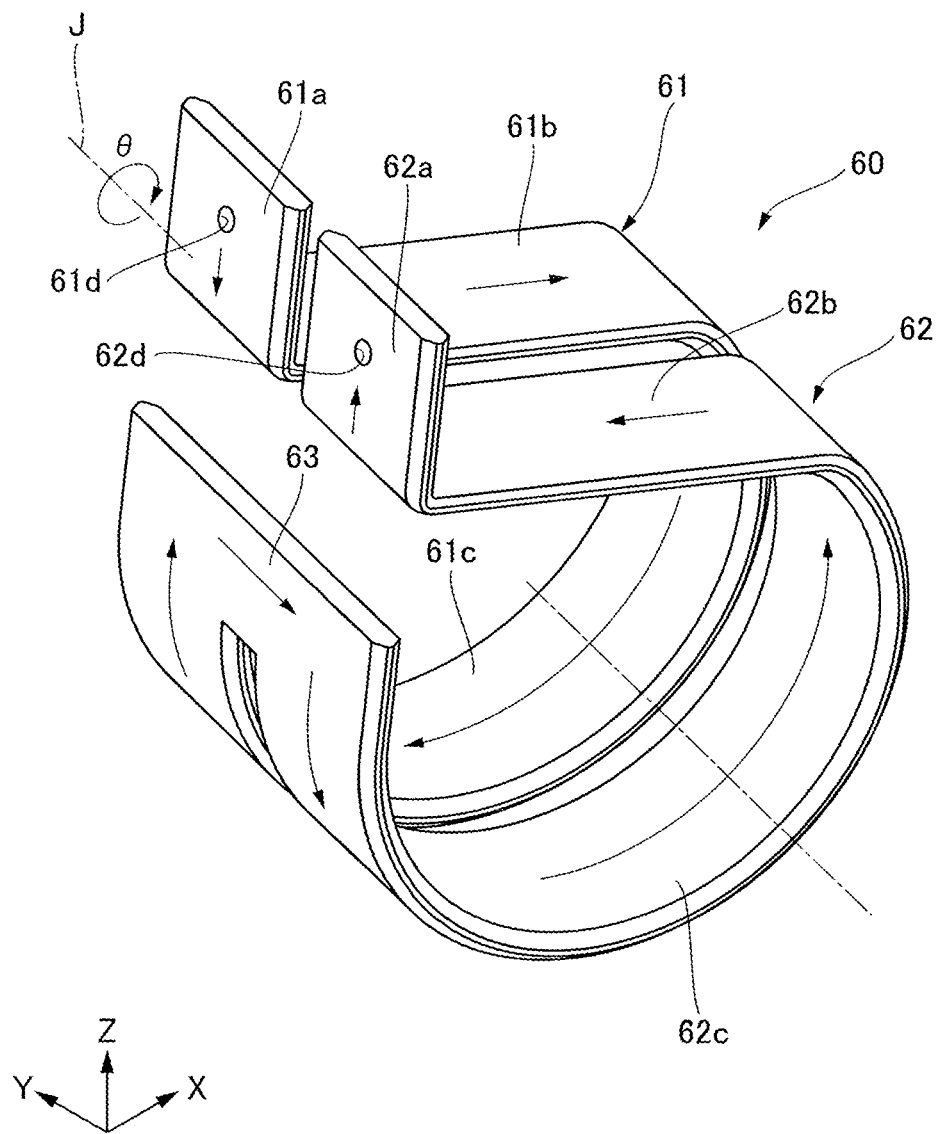
FIG. 5 is a perspective view illustrating a cooling unit 60 in the motor 1 in FIG. 1.

FIG. 5 is a perspective view illustrating the cooling unit 60 in the motor 1 in FIG. 1. Note that an internal space of the cooling unit 60 is illustrated in a three-dimensional shape in FIG. 5. As illustrated in FIG. 5, the cooling unit 60 has an upstream-side cooling flow path 61 and a downstream-side cooling flow path 62 that serve as a plurality of cooling flow paths and a connection flow path unit 63. As illustrated in FIG. 4, the surface of the side wall 40 on the other side in the width direction has an inlet port 16 to which the coolant flowing through the cooling unit 60 flows and an outlet port 17 from which the coolant flowing through the cooling unit 60 flows. In addition, the surface of the side wall 40 on the one side in the width direction is a surface on the outer side in the radial direction. The inlet port 16 is disposed in a surface of the first side wall of the side walls 40 on the outer side in the radial direction. The outlet port 17 is disposed in a surface of the second side wall of the side walls 40 on the outer side in the radial direction. The inlet port 16 continues to an inlet unit 61d of the cooling unit 60. The outlet port 17 continues to an outlet unit 62d of the cooling unit 60. The coolant flowing through the cooling unit 60 is not particularly limited as long as the coolant is a fluid capable of cooling the motor 1. The coolant may be an antifreezing solution, a solution other than the antifreezing solution, or gas.

The cooling unit 60 has a first cooling flow path 61a that reaches an end (an end on the other side in the width direction in FIG. 5) of the partitioning wall 10d on one side in the radial direction from the inlet port 16 in the first side wall of the side walls 40. The inlet unit 61d that continues to the inlet port 16 continues to the cooling flow path 61a. The cooling unit 60 has a second cooling flow path 61b that reaches an end (an end on the one side in the width direction in FIG. 5) of the partitioning wall 10d on the other side in the radial direction from the first cooling flow path 61a at the end of the partitioning wall 10d on the one side in the radial direction in the partitioning wall 10d. The cooling unit 60 has a third cooling flow path 61c that extends on the one side in the circumferential direction from the second cooling flow path 61b at the end of the partitioning wall 10d on the other side in the radial direction and reaches the end of the peripheral wall 10b on the one side in the circumferential direction, in the peripheral wall 10b. The cooling unit 60 has a connection flow path unit 63 that serves as a fourth cooling flow path that extends on the other side in the axial direction from the third cooling flow path 61c at the end of the peripheral wall 10b on the one side in the circumferential direction and reaches the end of the peripheral wall 10b on the one side in the circumferential direction, which is the position of the outlet port 17 in the axial direction, in the peripheral wall 10b. The cooling unit 60 has a fifth cooling flow path 62c that extends on the other side in the circumferential direction from the connection flow path unit 63 that serves as the fourth cooling flow path at the end of the peripheral wall 10b on the one side in the circumferential direction, namely the position of the outlet port 17 in the axial direction and reaches the end of the peripheral wall 10b on the other side in the circumferential direction, in the peripheral wall 10b. The cooling unit 60 has a sixth cooling flow path 62b that reaches the end of the partitioning wall 10d on the one side in the radial direction from the fifth cooling flow path 62c at the end of the peripheral wall 10b on the other side in the circumferential direction, in the partitioning wall 10d. The cooling unit 60 has a seventh cooling flow path 62a that reaches the outlet port 17 from the sixth cooling flow path 62b at the end of the partitioning wall 10d on the one side in the radial direction, in the second side wall of the side walls 40. The outlet unit 62d that continues to the outlet port 17 continues to the cooling flow path 62b.

The upstream-side cooling flow path 61 has the first cooling flow path 61a, the second cooling flow path 61b, and the third cooling flow path 61c. The downstream-side cooling flow path 62 has the fifth cooling flow path 62c, the sixth cooling flow path 62b, and the seventh cooling flow path 62a. The coolant that has flow into the cooling unit 60 from the inlet port 16 flows in the order of the first cooling flow path 61a, the second cooling flow path 61b, the third cooling flow path 61c, the connection flow path unit 63 that serves as the fourth cooling flow path, the fifth cooling flow path 62c, the sixth cooling flow path 62b, and the seventh cooling flow path 62a and then flows out from the outlet port 17. The motor driving heat generation element 130, the DC-DC conversion heat generation element 143, the reactor 140, the condenser 141, and the charger heat generation element 135 are disposed along the cooling unit 60 in the order of the motor driving heat generation element 130, the DC-DC conversion heat generation element 143, the reactor 140, the condenser 141, and the charger heat generation element 135 from the upstream side of the cooling unit 60.

In the embodiment, the cooling unit 60 is molded at a sand mold portion with the shape of the cooling unit 60 when the housing 10 is produced through sand mold casting. As illustrated in FIGS. 1 and 2, the housing 10 has a plurality of discharge holes 19 that discharge the sand mold for molding the cooling unit 60. After manufacturing the housing 10 through the sand mold casting, the sand mold for molding the cooling unit 60 from the discharge holes 19 is discharged. The discharge holes 19 continue to the cooling unit 60. Cap bodies 80 are press-fitted into the discharge holes 19. The discharge holes 19 are blocked with the cap bodies 80, and it is possible to prevent the coolant in the cooling unit 60 from leaking to the outside of the housing 10.

<Disposition of Motor Driving Heat Generation Element 130 and Charger Heat Generation Element 135>

The motor driving heat generation element 130 is disposed to face the first cooling flow path 61a. The charger heat generation element 135 is disposed to face the seventh cooling flow path 62a. Therefore, the motor driving heat generation element 130 is disposed on the inlet port 16 side of the position at which the charger heat generation element 135 is disposed. That is, the motor driving inverter unit 132 is disposed on the inlet port 16 side of a position at which the charger inverter unit 137 is disposed. Therefore, it is possible to further cool the motor driving heat generation element 130 on the upstream side of the cooling unit 60 and to more efficiently cool the motor driving heat generation element 130 that generates heat during driving of the motor. In addition, since the motor stops during charging, and the motor driving heat generation element 130 does not generate heat, it is possible to sufficiently cool the charger heat generation element 135 that generates heat at this time even if the charger heat generation element 135 is disposed on the downstream side of the cooling unit 60. Also, it is possible to reduce the size of the device by effectively using disposition spaces for the motor driving heat generation element 130, the charger heat generation element 135, and the cooling unit 60.

<Disposition of DC-DC Conversion Heat Generation Element 143, Reactor 140, and Condenser 141>

The DC-DC conversion heat generation element 143 is disposed to face the second cooling flow path 61b. The reactor 140 is disposed to face the second cooling flow path 61b and the sixth cooling flow path 62b. The condenser 141 is disposed to face the sixth cooling flow path 62b.

<Vehicle>

Figure 6:
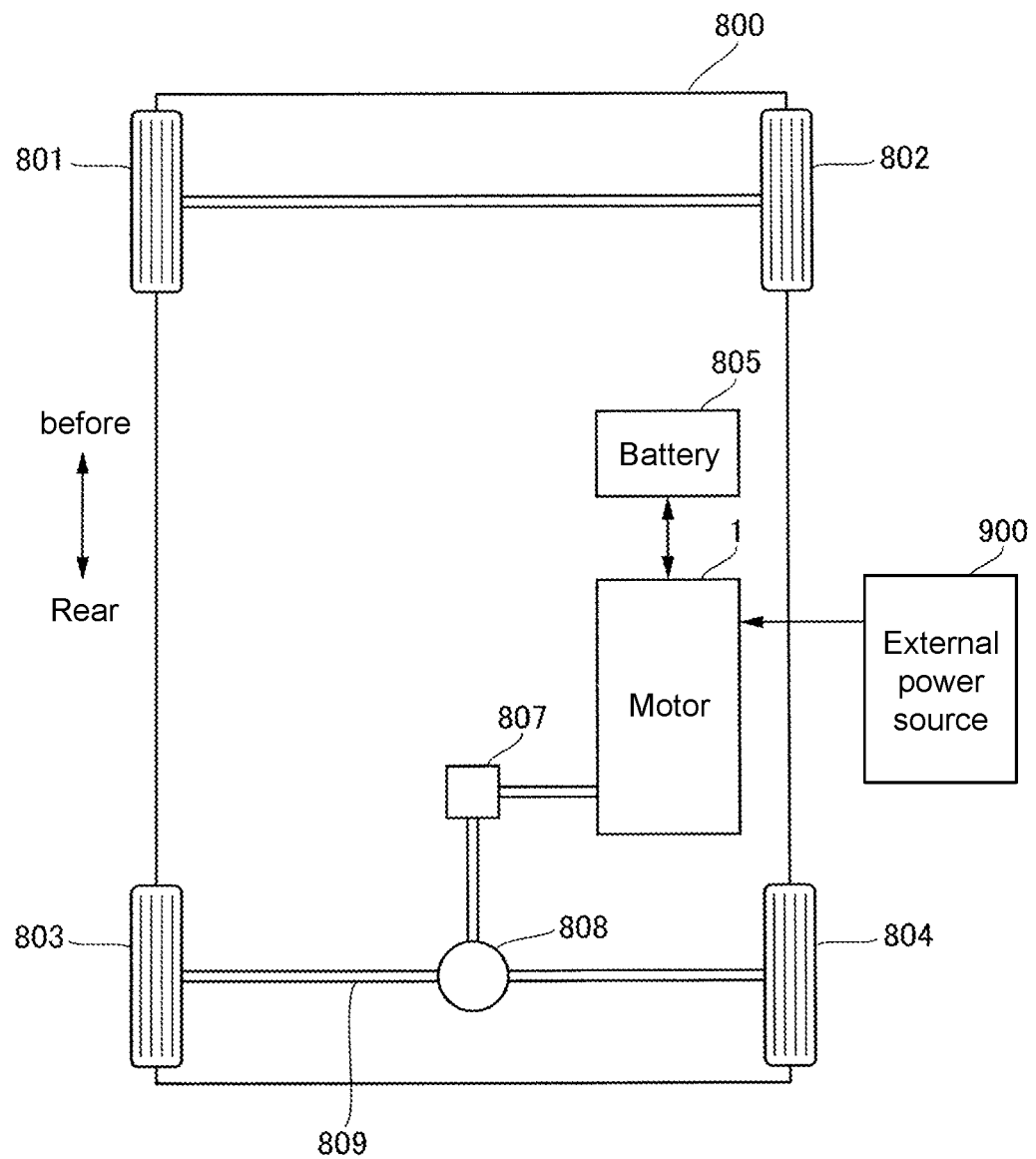
FIG. 6 is a block diagram illustrating a state in which the motor 1 in FIG. 1 is mounted in a vehicle.

FIG. 6 is a block diagram illustrating a state in which the motor in FIG. 1 is mounted in a vehicle. A vehicle 800 has a front left wheel 801, a front right wheel 802, a rear left wheel 803, a rear right wheel 804, the motor 1 illustrated in FIG. 1, the battery 805, the transmission 807, the differential gear 808, and an accelerator shaft 809. The vehicle 800 travels with the four wheels, namely the front left wheel 801, the front right wheel 802, the rear left wheel 803, and the rear right wheel 804.

A DC voltage supplied from the battery 805 is converted into a three-phase AC voltage by the motor driving device 131 of the motor 1 and is supplied to the stator 30, thereby causing the rotor 20 to rotate. The rotation of the rotor 20 is delivered to the rear left wheel 803 and the rear right wheel 804 via the transmission 807, the differential gear 808, and the accelerator shaft 809. Although FIG. 6 illustrates an example of driving with the rear wheels, the vehicle 800 may be driven with the front wheels or with four wheels.

The external power source 900 is a charging stand, for example. The battery 805 is charged with a voltage supplied from the external power source 900 via the charger 136 of the motor 1 by connecting the motor 1 to the external power source 900 when the vehicle 800 stops, for example.

Each component illustrated in FIG. 6 operates under control of an electronic control unit (ECU) which is mounted in the vehicle 800 and is not illustrated in the drawing.

First Modification Example

Figure 7:
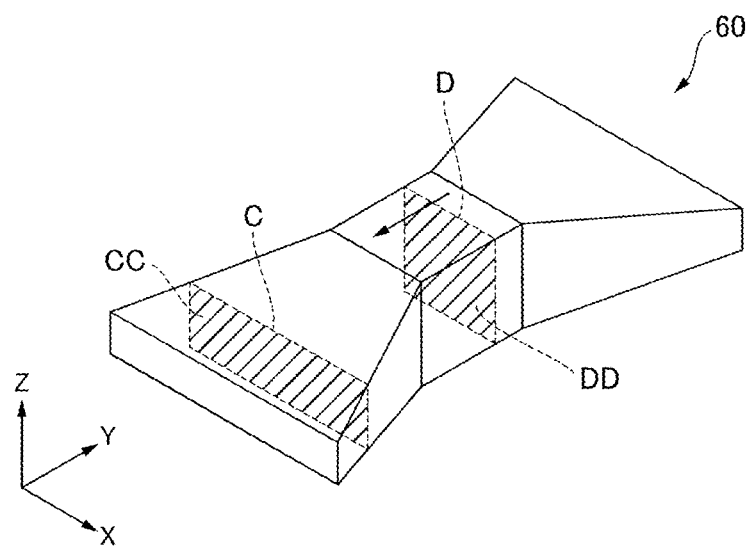
FIG. 7 is an explanatory diagram of a first modification example of the disclosure and is a perspective view illustrating a part of the cooling unit 60.

Hereinafter, a modification example of the shape of the cooling unit 60 in the aforementioned embodiment will be described. FIG. 7 is an explanatory diagram of a first modification example of the disclosure and is a perspective view illustrating a part of the cooling unit 60. In FIG. 7, the arrow in the drawing represents a direction in which the coolant flows. As illustrated in FIG. 7, a sectional area CC of the cooling unit 60 at a position C is equal to a sectional area DD at a position D in the first modification example. That is, the sectional area of the surface that is perpendicular to the direction in which the coolant flows in the cooling unit 60 is constant at a certain location and at another location in the cooling unit 60. Therefore, it is possible to reduce a pressure loss that may occur in the flow of the coolant in the cooling unit 60.

Second Modification Example

Figure 8:
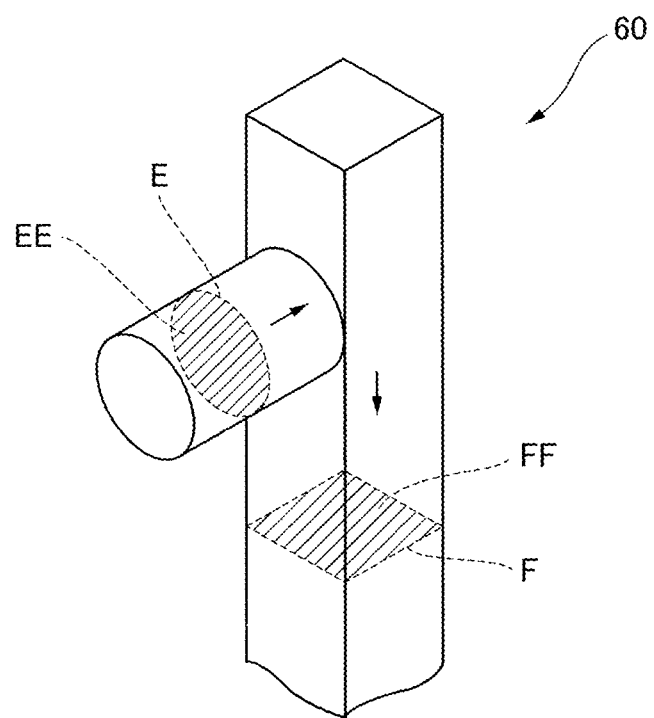
FIG. 8 is an explanatory diagram of a second modification example of the disclosure and is a perspective view illustrating a part of the cooling unit 60.

FIG. 8 is an explanatory diagram of a second modification example of the disclosure and is a perspective view illustrating a part of the cooling unit 60. In FIG. 8, the arrow in the drawing represents a direction in which the coolant flows. As illustrated in FIG. 7, a sectional area EE of the cooling unit 60 at a position E is equal to a sectional area FF at a position F in the second modification example. Also, the sectional shape at the position E is a circular shape while the sectional shape at the position F is a rectangular shape. That is, the sectional shapes of the surface that is perpendicular to the direction in which the coolant flows differ at a certain location and another location of the cooling unit 60, and the sectional area is constant. Therefore, it is possible to reduce a pressure loss that may occur in the flow of the coolant in the cooling unit 60 with different sectional shapes.

Second Embodiment

In a second embodiment of the disclosure, the same reference numerals are used for components that are the same as those in the first embodiment. In the second embodiment, the motor 201 has a housing 210 instead of the housing 10 in the first embodiment. Components in the second embodiment as alternatives of those in the first embodiment are the same as those in the first embodiment unless particularly stated otherwise.

Figure 9:
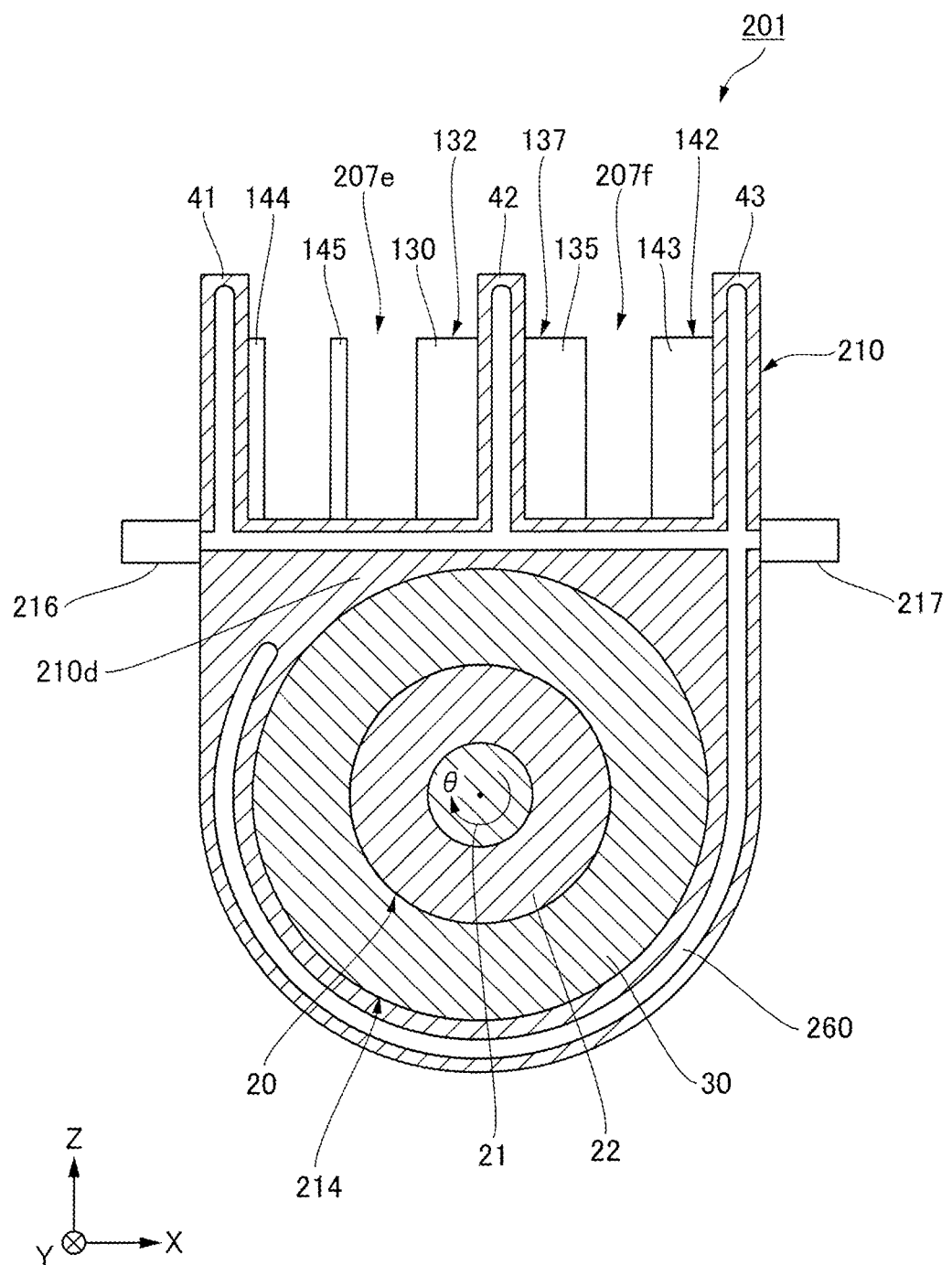
FIG. 9 is a sectional view of a motor 201 according to a second embodiment of the disclosure, which corresponds to FIG. 3 in the first embodiment.

FIG. 9 is a sectional view of a motor 201 according to the second embodiment of the disclosure, which corresponds to FIG. 3 in the first embodiment. The housing 210 has a stator accommodation unit 214 that accommodates the stator 30, an inverter accommodation unit 207e that accommodates a motor driving inverter unit 132 of a motor driving device 131, and a charger accommodation unit 207f that accommodates a charger inverter unit 137 of a charger 136. The housing 210 is a single member. The inverter accommodation unit 207e is positioned outside the stator accommodation unit 214 in the radial direction. The charger accommodation unit 207f is positioned outside the stator accommodation unit 214 in the radial direction. The inverter accommodation unit 207e and the charger accommodation unit 207f are partitioned with an intermediate partitioning wall 42. The motor driving inverter unit 132 has a driver board 144 and a control board 145. The driver board 144 and the control board 145 are accommodated in the inverter accommodation unit 207e. A DC-DC conversion inverter unit 142 of a DC-DC conversion unit 146 is accommodated in the charger accommodation unit 207f. The motor driving inverter unit 132 has a motor driving heat generation element 130. The charger inverter unit 137 has a charger heat generation element 135. The DC-DC conversion inverter unit 142 has a DC-DC conversion heat generation element 143.

The housing 210 has a first end wall 41, the intermediate partitioning wall 42, a second end wall 43, and a partitioning wall 210d. The partitioning wall 210d partitions the stator accommodation unit 214, and the inverter accommodation unit 207e and the charger accommodation unit 207f. The first end wall 41 extends outwardly in the radial direction (on the one side in the vertical direction in FIG. 9) from one end of the partitioning wall 210d in the radial direction (the end on the other side in the width direction in FIG. 9) and in a direction that is perpendicular to a surface of the partitioning wall 210d. The second end wall 43 extends outwardly in the radial direction (on the one side in the vertical direction in FIG. 9) from the other end of the partitioning wall 210d in the radial direction (the end on the one side in the width direction in FIG. 9) and in a direction that is perpendicular to a surface of the partitioning wall 210d. The intermediate partitioning wall 42 is disposed between the first end wall 41 and the second end wall 43 and extends outwardly in the radial direction (on the one side in the vertical direction in FIG. 9) from a surface of the partitioning wall 210d and in a direction that is perpendicular to a surface of the partitioning wall 210d. The first end wall 41, the second end wall 43, and the intermediate partitioning wall 42 have plate shapes in parallel with the axial direction Y. The inverter accommodation unit 207e is surrounded by the first end wall 41, the partitioning wall 210d, and the intermediate partitioning wall 42. The charger accommodation unit 207f is surrounded by the second end wall 43, the partitioning wall 210d, and the intermediate partitioning wall 42. An inlet port 216 is disposed in the surface of the first end wall 41 on the other side in the width direction. An outlet port 217 is disposed in the surface of the second end wall 43 on the one side in the width direction.

Figure 10:
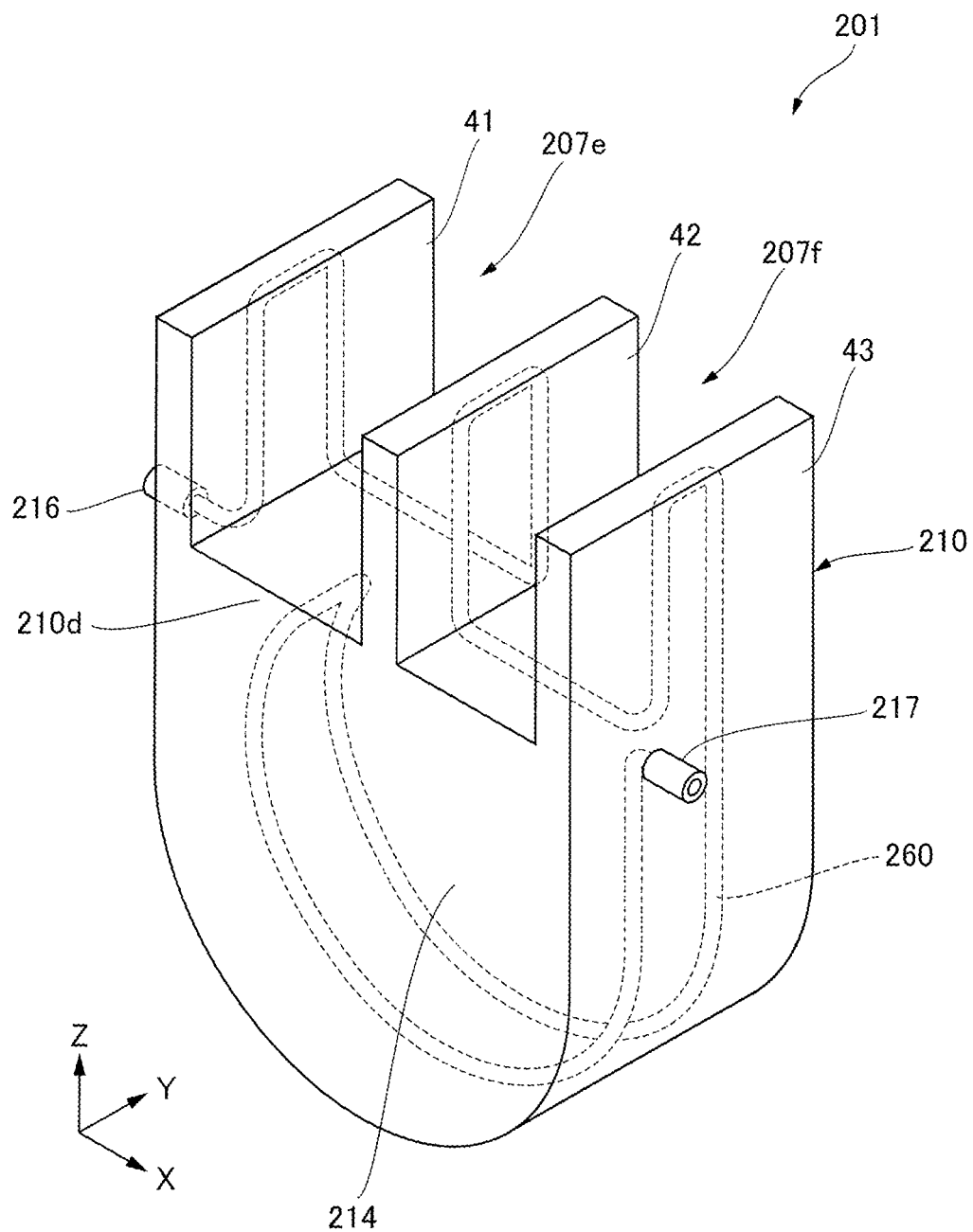
FIG. 10 is a perspective view illustrating a cooling unit 260 in the motor 201 in FIG. 9.

The housing 210 has a cooling unit 260. FIG. 10 is a perspective view illustrating the cooling unit 260 in the motor 201 in FIG. 9. The coolant flowing through the cooling unit 260 flows in from the inlet port 216. The coolant flowing through the cooling unit 260 flows out from the outlet port 217. As illustrated in FIG. 10, the cooling unit 260 extends from the inlet port 216 to the first end wall 41. In addition, the cooling unit 260 extends from the first end wall 41 to the intermediate partitioning wall 42 via the partitioning wall 210d. In addition, the cooling unit 260 extends from the intermediate partitioning wall 42 to the second end wall 43 via the partitioning wall 210d. The first end wall 41 has the cooling unit 260 that serves as the cooling flow path. The intermediate partitioning wall 42 has the cooling unit 260 that serves as the cooling flow path. The second end wall 43 has the cooling unit 260 that serves as the cooling flow path. The partitioning wall 210d has the cooling unit 260 that serves as the cooling flow path. In addition, although a linear flow path is illustrated as the cooling unit 260 in FIG. 10, it is desirable that the cooling unit 260 have a shape expanding along the surfaces of the first end wall 41, the partitioning wall 210d, the intermediate partitioning wall 42, and the second end wall 43, and according to the shape, it is possible to further enhance the cooling effect.

The driver board 144 is disposed in the surface of the surfaces of the first end wall 41 on the one side in the width direction. The driver board 144 is disposed in contact with the first end wall 41. At this time, an insulating heat releasing gel or the like is disposed between the driver board 144 and the first end wall 41 to secure insulation. The motor driving inverter unit 132 is disposed on the surface of the surfaces of the intermediate partitioning wall 42 on the other side in the width direction. The control board 145 is disposed between the driver board 144 and the motor driving inverter unit 132 with distances from the driver board 144 and the motor driving inverter unit 132.

The charger inverter unit 137 is disposed on the surface of the surfaces of the intermediate partitioning wall 42 on the one side in the width direction. The DC-DC conversion inverter unit 142 is disposed on the surface of the surfaces of the second end wall 43 on the other side in the width direction.

The driver board 144 is disposed such that the surface of the driver board 144 is in an orientation in parallel to the first end wall 41. The control board 145 is disposed such that the surface of the control board 145 is in an orientation in parallel to the first end wall 41. Therefore, it is possible to reduce the size of the motor 201 in the orientation in parallel to the partitioning wall. Also, the driver board 144 and the control board 145 are disposed in the orientation (vertical orientation) in parallel to the first end wall 41 and the intermediate partitioning wall 42. Therefore, it is possible to realize the size reduction of the motor 201 that is a mechatronic motor by effectively using the accommodation space in the inverter accommodation unit 207e between the first end wall 41 and the intermediate partitioning wall 42.

Third Embodiment

Figure 11:
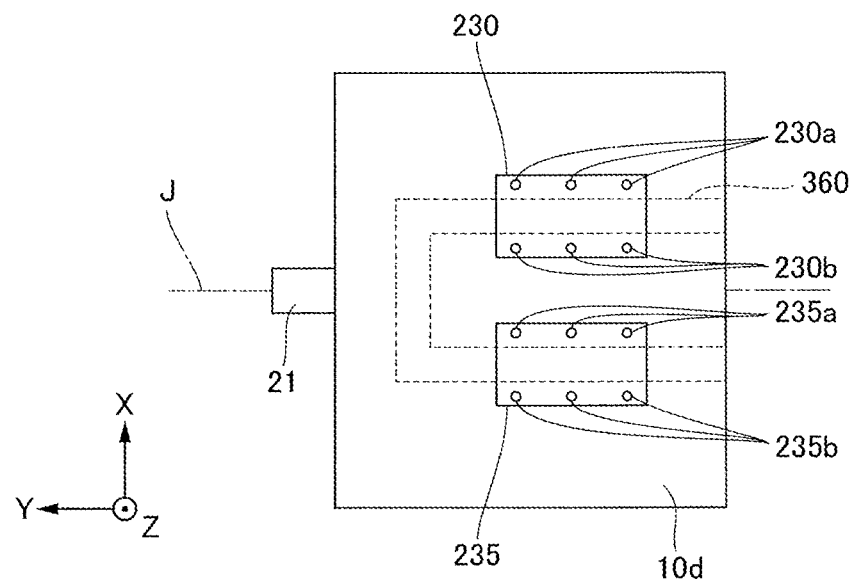
FIG. 11 is a plan view illustrating a disposition of a heat generation element according to a third embodiment of the disclosure.

Disposition of each heat generation element and the cooling flow path will be described in a third embodiment of the disclosure. The heat generation element described in the third embodiment may be any of the heat generation elements in the aforementioned respective embodiments. FIG. 11 is a plan view illustrating disposition of a heat generation element according to the third embodiment of the disclosure. Referring to FIG. 11, an example in which a first heat generation element 230 and a second heat generation element 235 are arranged to face a cooling flow path 360 in a component in which the cooling flow path 360 is disposed instead of the cooling unit 60 in the partitioning wall 10d illustrated in FIG. 4 will be described.

The first heat generation element 230 is disposed in a surface among the surfaces of the partitioning wall 10d on the one side in the vertical direction. The first heat generation element 230 is fixed to a partitioning wall 10d with first fixing units 230a and second fixing units 230b. The first fixing units 230a and the second fixing units 230b are bolts, for example. Although the first heat generation element 230 is fixed to the partitioning wall 10d with the three first fixing units 230a and the three second fixing units 230b in FIG. 11, the numbers of the first fixing units 230a and the second fixing units 230b may be other numbers. The first heat generation element 230 in parallel to a specific direction indicates that the line connecting the plurality of first fixing units 230a and the line connecting the plurality of second fixing units 230b are in parallel to the specific direction. The specific direction is the axial direction Y. The first heat generation element 230 is disposed in parallel to the axial direction Y (specific direction).

The second heat generation element 235 is disposed in the surface among the surfaces of the partitioning wall 10d on the one side in the vertical direction. The second heat generation element 235 is fixed to a partitioning wall 10d with third fixing units 235a and fourth fixing units 235b. The third fixing units 235a and the fourth fixing units 235b are bolts, for example. Although the second heat generation element 235 is fixed to the partitioning wall 10d with the three third fixing units 235a and the three fourth fixing units 235b in FIG. 11, the numbers of the third fixing units 235a and the fourth fixing units 235b may be other numbers. The second heat generation element 235 in parallel to a specific direction indicates that the line connecting the plurality of third fixing units 235a and the line connecting the plurality of fourth fixing units 235b are in parallel to the specific direction. The second heat generation element 235 is disposed in parallel to the axial direction Y (specific direction).

The cooling flow path 360 is disposed between the first fixing units 230a and the second fixing units 230b. The cooling flow path 360 is disposed between the third fixing units 235a and the fourth fixing units 235b. The cooling flow path 360 is disposed between the second fixing units 230b and the third fixing units 235a.

As illustrated in FIG. 11, the cooling flow path 360 is disposed at a location other than a location between the adjacent second fixing units 230b and the third fixing units 235a. Therefore, the cooling flow path 360 does not pass through a position at which no cooling target is obviously present between the first heat generation element 230 and the second heat generation element 235, and it is possible to perform efficient cooling. Also, it is possible to reduce the size of the motor 1 by effectively using disposition spaces for the cooling flow path 360.

In addition, since the cooling flow path 360 is not present between the second fixing units 230b and the third fixing units 235a, it is easy to secure a depth of the bolt holes when the fixing units such as bolts are used. In addition, since the bolt holes are present at such positions at which the bolt holes do not overlap with the cooling flow path 360, it is possible to curb the thickness of the housing 10 at locations at which the first heat generation element 230 and the second heat generation element 235 are disposed when the bolt depth is secured.

The cooling flow path 360 has a parallel direction flow path through which the coolant flows in a direction in parallel to the axial direction Y (specific direction). The first heat generation element 230 and the second heat generation element 235 are disposed to face the parallel direction flow path. The cooling flow path 360 has an orthogonal direction flow path through which the coolant flows in a direction that perpendicularly intersects the axial direction Y (specific direction). The cooling flow path 360 has a plurality of parallel direction flow paths.

Fourth Embodiment

Figure 12:
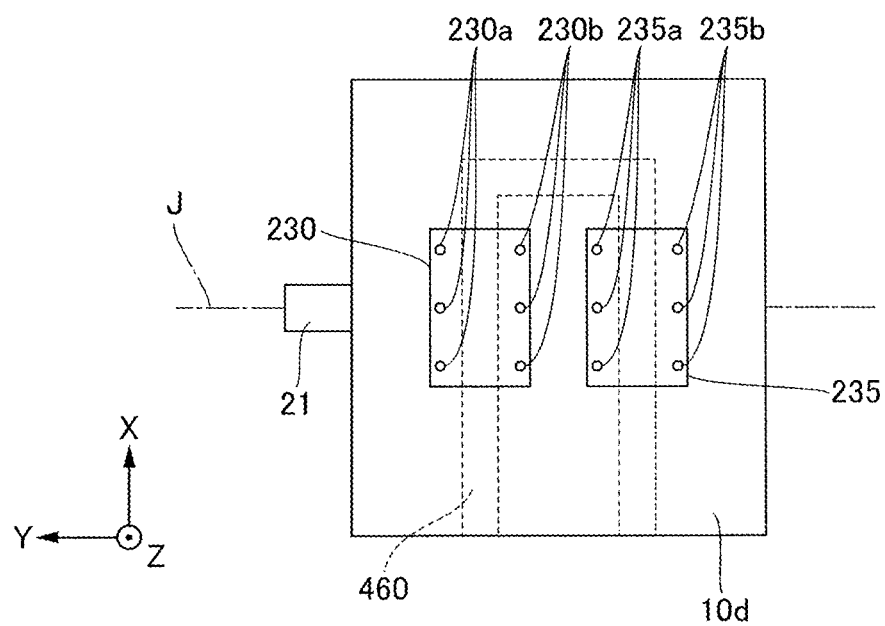
FIG. 12 is a plan view illustrating a disposition of a heat generation element according to a fourth embodiment of the disclosure.

Disposition of each heat generation element and the cooling flow path will be described in a fourth embodiment of the disclosure. The heat generation element described in the fourth embodiment may be any of the heat generation elements in the aforementioned respective embodiments. FIG. 12 is a plan view illustrating disposition of a heat generation element according to the fourth embodiment of the disclosure. Referring to FIG. 12, an example in which a first heat generation element 230 and a second heat generation element 235 are arranged to face a cooling flow path 460 in a component in which the cooling flow path 460 is disposed instead of the cooling unit 60 in the partitioning wall 10d illustrated in FIG. 4 will be described. Description of the same points as those in the third embodiment will be omitted.

In the fourth embodiment, the specific direction is the direction that is perpendicular to the axial direction Y. The first heat generation element 230 is disposed in parallel to the direction that is perpendicular to the axial direction Y (specific direction). The second heat generation element 235 is disposed in parallel to the direction that is perpendicular to the axial direction Y (specific direction).

The cooling flow path 460 is disposed between the first fixing units 230a and the second fixing units 230b. The cooling flow path 460 is disposed between the third fixing units 235a and the fourth fixing units 235b. The cooling flow path 460 is disposed between the second fixing units 230b and the third fixing units 235a.

The cooling flow path 460 has a parallel direction flow path through which the coolant flows in the direction in parallel to the direction that perpendicularly intersects the axial direction Y (specific direction). The first heat generation element 230 and the second heat generation element 235 are disposed to face the parallel direction flow path. The cooling flow path 460 has an orthogonal direction flow path through which the coolant flows in a direction that is perpendicular to the direction that perpendicularly intersects the axial direction Y (specific direction). The cooling flow path 460 has a plurality of parallel direction flow paths.

Fifth Embodiment

Figure 13:
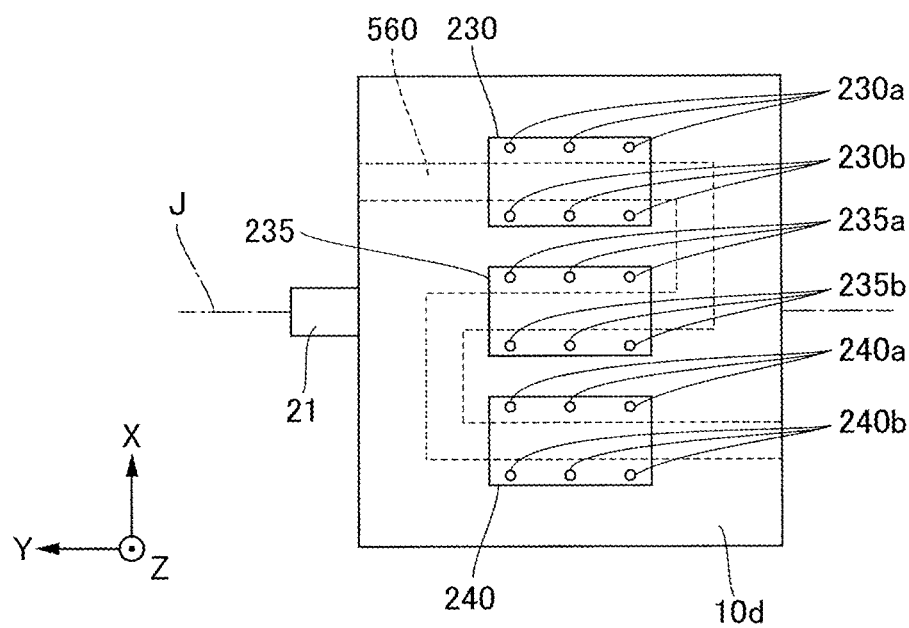
FIG. 13 is a plan view illustrating a disposition of a heat generation element according to a fifth embodiment of the disclosure.

Disposition of each heat generation element and the cooling flow path will be described in a fifth embodiment of the disclosure. The heat generation element described in the fifth embodiment may be any of the heat generation elements in the aforementioned respective embodiments. FIG. 13 is a plan view illustrating disposition of a heat generation element according to the fifth embodiment of the disclosure. Referring to FIG. 13, an example in which a first heat generation element 230, a second heat generation element 235, and a third heat generation element 240 are arranged to face a cooling flow path 560 in a component in which the cooling flow path 560 is disposed instead of the cooling unit 60 in the partitioning wall 10d illustrated in FIG. 4 will be described. Description of the same points as those in the third embodiment will be omitted.

The third heat generation element 240 is disposed in the surface of the surfaces of the partitioning wall 10d on the one side in the vertical direction. The third heat generation element 240 is fixed to a partitioning wall 10d with fifth fixing units 240a and sixth fixing units 240b. The fifth fixing units 240a and the sixth fixing units 240b are bolts, for example. Although the third heat generation element 240 is fixed to the partitioning wall 10d with the three fifth fixing units 240a and the three sixth fixing units 240b in FIG. 13, the numbers of the fifth fixing units 240a and the sixth fixing units 240b may be other numbers. In the fifth embodiment, the specific direction is the axial direction Y. The third heat generation element 240 is disposed in parallel to the axial direction Y (specific direction).

The cooling flow path 560 is disposed between the first fixing units 230a and the second fixing units 230b. The cooling flow path 560 is disposed between the third fixing units 235a and the fourth fixing units 235b. The cooling flow path 560 is disposed between the fifth fixing units 240a and the sixth fixing units 240b. The cooling flow path 560 is not disposed between the second fixing units 230b and the third fixing units 235a. The cooling flow path 560 is not disposed between the fourth fixing units 235b and the fifth fixing units 240a.

The cooling flow path 560 has a parallel direction flow path through which the coolant flows in a direction in parallel to the axial direction Y (specific direction). The first heat generation element 230, the second heat generation element 235, and the third heat generation element 240 are disposed to face the parallel direction flow path. The cooling flow path 560 has an orthogonal direction flow path through which the coolant flows in a direction that is perpendicular to the axial direction Y (specific direction). The cooling flow path 560 has a plurality of parallel direction flow paths. The cooling flow path 560 has a plurality of orthogonal direction flow paths. The cooling flow path 560 is disposed in a bellows shape in which the cooling flow path 560 is bent a plurality of times relative to the direction that is perpendicular to the axial direction Y (specific direction). The cooling flow path 560 may be disposed in the bellows shape in which the cooling flow path 560 is bent a plurality of times relative to the axial direction Y (specific direction).

Sixth Embodiment

Figure 14:
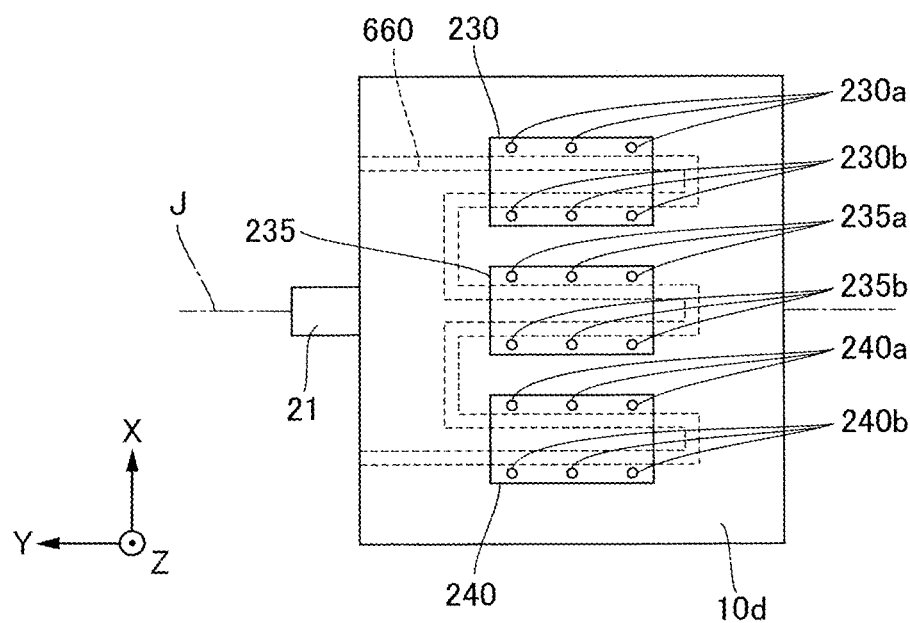
FIG. 14 is a plan view illustrating a disposition of a heat generation element according to a sixth embodiment of the disclosure.

Disposition of each heat generation element and the cooling flow path will be described in a sixth embodiment of the disclosure. The heat generation element described in the sixth embodiment may be any of the heat generation elements in the aforementioned respective embodiments. FIG. 14 is a plan view illustrating disposition of a heat generation element according to the sixth embodiment of the disclosure. Referring to FIG. 14, an example in which a first heat generation element 230, a second heat generation element 235, and a third heat generation element 240 are arranged to face a cooling flow path 660 in a component in which the cooling flow path 660 is disposed instead of the cooling unit 60 in the partitioning wall 10d illustrated in FIG. 4 will be described. Description of the same points as those in the fifth embodiment will be omitted.

In the sixth embodiment, the specific direction is the axial direction Y. The first heat generation element 230, the second heat generation element 235, and the third heat generation element 240 are disposed in parallel to the axial direction Y (specific direction). The cooling flow path 660 is disposed to reciprocate between the first fixing units 230a and the second fixing units 230b. The cooling flow path 660 is disposed to reciprocate between the third fixing units 235a and the fourth fixing units 235b. The cooling flow path 660 is disposed to reciprocate between the fifth fixing units 240a and the sixth fixing units 240*b*. The cooling flow path 660 is not disposed between the second fixing units 230*b* and the third fixing units 235*a*. The cooling flow path 660 is not disposed between the fourth fixing units 235*b* and the fifth fixing units 240*a*.

The cooling flow path 660 has a parallel direction flow path through which the coolant flows in a direction in parallel to the axial direction Y (specific direction). The first heat generation element 230, the second heat generation element 235, and the third heat generation element 240 are disposed to face the parallel direction flow path. The cooling flow path 660 has an orthogonal direction flow path through which the coolant flows in a direction that is perpendicular to the axial direction Y (specific direction). The cooling flow path 660 has a plurality of parallel direction flow paths. The cooling flow path 660 has a plurality of orthogonal direction flow paths. The cooling flow path 660 is disposed in a bellows shape in which the cooling flow path 660 is bent a plurality of times relative to the direction that is perpendicular to the axial direction Y (specific direction). The cooling flow path 660 may be disposed in the bellows shape in which the cooling flow path 660 is bent a plurality of times relative to the axial direction Y (specific direction).

<Effects and Advantages of Motor 1>

Next, some of the effects and advantages of the motor 1 will be described.

(1) According to the disclosure in the aforementioned embodiments, the motor driving inverter unit 132 is disposed on the inlet port 16 side of the position at which the charger inverter unit 137 is disposed. Therefore, it is possible to further cool the motor driving inverter unit 132 on the upstream side of the cooling unit 60 and to more efficiently cool the motor driving inverter unit 132 that generates heat during power distribution to the stator 30. In addition, since the power distribution to the stator 30 stops during charging, and the motor driving inverter unit 132 does not generate heat, it is possible to sufficiently cool the charger inverter unit 137 that generates heat at this time even if the charger inverter unit 137 is disposed on the downstream side of the cooling unit 60. Also, it is possible to reduce the size of the motor 1 by effectively using disposition spaces for the motor driving inverter unit 132, the charger inverter unit 137, and the cooling unit 60. Also, it is possible to provide a motor 1 characterized by disposition of each component.

(2) Also, the motor driving heat generation element 130 is disposed on the inlet port 16 side of the position at which the charger heat generation element 135 is disposed. Therefore, it is possible to further cool the motor driving heat generation element 130 on the upstream side of the cooling unit 60 and to more efficiently cool the motor driving heat generation element 130 that generates heat during power distribution to the stator 30. In addition, since the power distribution to the stator 30 stops during charging, and the motor driving heat generation element 130 does not generate heat, it is possible to sufficiently cool the charger heat generation element 135 that generates heat at this time even if the charger heat generation element 135 is disposed on the downstream side of the cooling unit 60. Also, it is possible to reduce the size of the motor 1 by effectively using disposition spaces for the motor driving heat generation element 130, the charger heat generation element 135, and the cooling unit 60.

(3) Also, the motor driving heat generation element 130 has a plurality of switching elements, and the charger heat generation element 135 has a plurality of switching elements. Therefore, it is possible to efficiently cool the switching elements with the cooling unit 60 and to reduce the size of the motor 1 by effectively using the disposition spaces for the switching elements and the cooling unit.

(4) In addition, the plurality of switching elements of the motor driving heat generation element 130 and the charger heat generation element 135 are a plurality of IGBTs. Therefore, it is possible to efficiently cool the IGBTs with the cooling unit 60 and to reduce the size of the motor 1 by effectively using disposition spaces for the IGBTs and the cooling flow path.

(5) Also, the motor driving heat generation element 130, the DC-DC conversion heat generation element 143, the reactor 140, the condenser 141, and the charger heat generation element 135 are disposed in this order from the upstream of the cooling unit 60. Therefore, it is possible to efficiently cool the components that generate heat at the time of power distribution to the stator 30.

(6) In addition, the coolant flows in the cooling flow paths (the upstream-side cooling flow path 61, the connection flow path 63, and the downstream-side cooling flow path 62) provided in the side walls 40 (the first side wall and the second side wall), the partitioning wall 10*d*, and the peripheral wall 10*b*. Therefore, it is possible to efficiently cool the motor driving heat generation element 130, the DC-DC conversion heat generation element 143, the reactor 140, the stator 30, the condenser 141, and the charger heat generation element 135 fixed to the side walls 40 (the first side wall and the second side wall), the partitioning wall 10*d*, and the peripheral wall 10*b*.

(7) In addition, the first side wall and the second side wall of the side walls 40 are single members. Therefore, it is possible to reduce the size of the housing 10 and to reduce the size of the motor 1.

(8) In addition, the housing 10 that has the stator accommodation unit 14, the inverter accommodation unit 107*e*, and the charger accommodation unit 107*f* is a single member. The housing 210 that has the stator accommodation unit 214, the inverter accommodation unit 207*e*, and the charger accommodation unit 207*f* is a single member. Therefore, it is possible to reduce the size of the motor 1 using mechatronics.

(9) Also, the sectional area of the surface that perpendicularly intersects the direction in which the coolant flows in the cooling unit 60 is constant at a certain location and at another location in the cooling unit 60. Therefore, it is possible to reduce a pressure loss that the coolant receives when flowing through the cooling unit 60 and to efficiently cool the heat generation elements (the motor driving heat generation element 130, the DC-DC conversion heat generation element 143, the reactor 140, the stator 30, the condenser 141, and the charger heat generation element 135).

(10) In addition, the sectional shapes of the surface that perpendicularly intersects the direction in which the coolant flows differ at a certain location and another location of the cooling unit 60, and the sectional area is constant. Therefore, it is possible to reduce a pressure loss that the coolant receives when flowing through the cooling unit 60 and to efficiently cool the heat generation elements (the motor driving heat generation element 130, the DC-DC conversion heat generation element 143, the reactor 140, the stator 30, the condenser 141, and the charger heat generation element 135) even if the sectional shapes differ from each other.

(11) Also, the motor driving inverter unit 132 is disposed on the inlet port 16 side of a position at which the charger inverter unit 137 is disposed in the vehicle. Therefore, it is possible to further cool the motor driving inverter unit 132 on the upstream side of the cooling unit 60 and to more efficiently cool the motor driving inverter unit 132 that generates heat during power distribution to the stator 30. In addition, since the power distribution to the stator 30 stops during charging, and the motor driving inverter unit 132 does not generate heat, it is possible to sufficiently cool the charger inverter unit 137 that generates heat at this time even if the charger inverter unit 137 is disposed on the downstream side of the cooling unit 60. Also, it is possible to reduce the size of the motor 1 by effectively using disposition spaces for the motor driving inverter unit 132, the charger inverter unit 137, and the cooling unit 60.

Purposes of the motor according to the aforementioned embodiments are not particularly limited. The motor according to the aforementioned embodiment is mounted in a vehicle, for example. Also, the aforementioned respective components may appropriately be combined without conflicting with each other.

Although exemplary embodiments of the disclosure have been described above, the disclosure is not limited to these embodiments, and various modifications and changes can be made within the gist thereof. These embodiments and the modifications are included in the scope of the disclosure and the gist thereof and are also included in the claims described in the claims and a scope equivalent thereto.

What is claimed is:

1. A motor comprising:
 a rotor that has a motor shaft disposed along a central axis extending in an axial direction;
 a stator that faces the rotor with a gap interposed therebetween in a radial direction;
 a motor driving inverter unit that supplies electric power from a battery to the stator;
 a charger that has a charger inverter unit for charging the battery; and
 a housing that accommodates the stator, the motor driving inverter unit, and the charger,
 wherein the housing has
  a cooling flow path through which a coolant flows,
  an inlet port into which the coolant flowing in the cooling flow path flows, and
  an outlet port from which the coolant flowing in the cooling flow path flows,
 the motor driving inverter unit and the charger inverter unit are disposed in the housing along the cooling flow path, and
 the motor driving inverter unit is disposed closer to a side of the inlet port than a position where the charger inverter unit is disposed,
 the motor driving inverter unit has a motor driving heat generation element,
 the charger inverter unit has a charger heat generation element, and the motor driving heat generation element and the charger heat generation element are disposed along the cooling flow path, and
 the motor driving heat generation element is disposed closer to a side of the inlet port side than a position where the charger heat generation element is disposed, and
 the motor further comprises:
 a condenser that smooths a voltage connected to the battery;
 a reactor that smooths the voltage connected to the battery; and
 a DC-DC conversion unit that boosts and lowers a voltage between the motor driving inverter unit and the battery,
 wherein the DC-DC conversion unit has a DC-DC conversion heat generation element, and
 the motor driving heat generation element, the DC-DC conversion heat generation element, the reactor, the condenser, and the charger heat generation element are sequentially disposed along the cooling flow path from an upstream to a downstream of a flow in the cooling flow path.

2. The motor according to claim 1,
 wherein the motor driving heat generation element has a plurality of switching elements, and
 the charger heat generation element has a plurality of switching elements.

3. The motor according to claim 2, wherein the plurality of switching elements of the motor driving heat generation element and the plurality of switching elements of the charger heat generation element are a plurality of IGBTs.

4. The motor according to claim 1,
 wherein the housing has
  a stator accommodation unit that accommodates the stator,
  an inverter accommodation unit that is positioned outside the stator accommodation unit in the radial direction and accommodates the motor driving inverter unit,
  a charger accommodation unit that is positioned outside the stator accommodation unit in the radial direction and accommodates the charger,
  a tubular peripheral wall that covers an outer peripheral surface of the stator and surrounds the rotor and the stator on an outer side in the radial direction,
  a partitioning wall that partitions the stator accommodation unit, and the inverter accommodation unit and the charger accommodation unit,
  a first side wall that extends outwardly in the radial direction from an end of the partitioning wall on one side in the radial direction and in a direction that is perpendicular to a surface of the partitioning wall, and
  a second side wall that extends outwardly in the radial direction from the end of the partitioning wall on the one side in the radial direction and in the direction that is perpendicular to the surface of the partitioning wall,
 wherein the peripheral wall has an end on one side in a circumferential direction in contact with an end of the partitioning wall on the other side in the radial direction,
 the motor driving heat generation element is fixed to a surface of the first side wall on an inner side in the radial direction,
 the charger heat generation element is fixed to a surface of the second side wall on the inner side in the radial direction,
 the DC-DC conversion heat generation element, the condenser, and the reactor are fixed to a surface of the partitioning wall on the outer side in the radial direction,
 the inlet port is disposed in a surface of the first side wall on the outer side in the radial direction,
 the outlet port is disposed in a surface of the second side wall on the outer side in the radial direction,
 the cooling flow path has
  a first cooling flow path that reaches an end of the partitioning wall on the one side in the radial direction from the inlet port in the first side wall, a second cooling flow path that reaches an end of the partitioning wall on the other side in the radial direction from the first cooling flow path at the end of the partitioning wall on the one side in the radial direction in the partitioning wall,
a third cooling flow path that extends on the one side in the circumferential direction from the second cooling flow path at the end of the partitioning wall on the other side in the radial direction and reaches the end of the peripheral wall on the one side in the circumferential direction in the peripheral wall,
a fourth cooling flow path that extends on the other side in the axial direction from the third cooling flow path at the end of the peripheral wall on the one side in the circumferential direction and reaches the end of the peripheral wall on the one side in the circumferential direction, which is at a position of the outlet port in the axial direction, in the peripheral wall,
a fifth cooling flow path that extends on the other side in the circumferential direction from the fourth cooling flow path at the end of the peripheral wall on the one side in the circumferential direction that is a position of the outlet port in the axial direction and reaches the end of the peripheral wall on the one side in the circumferential direction in the peripheral wall,
a sixth cooling flow path that reaches the end of the partitioning wall on the one side in the radial direction from the fifth cooling flow path at the end of the peripheral wall on the other side in the circumferential direction in the partitioning wall, and
a seventh cooling flow path that reaches the outlet port from the sixth cooling flow path at the end of the partitioning wall on the one side in the radial direction in the second side wall, and
the coolant that has flowed into the cooling flow path from the inlet port flows through the first cooling flow path, the second cooling flow path, the third cooling flow path, the fourth cooling flow path, the fifth cooling flow path, the sixth cooling flow path, and the seventh cooling flow path in this order and then flows out from the outlet port.

5. The motor according to claim 4, wherein the first side wall and the second side wall are single members.

6. The motor according to claim 4, wherein the housing that has the stator accommodation unit, the inverter accommodation unit, and the charger accommodation unit is a single member.

7. The motor according to claim 1, wherein in a direction in which the coolant flows in the cooling flow path, a sectional area of the cooling flow path in a direction that is perpendicular to the direction in which the coolant flows is constant.

8. The motor according to claim 7, wherein in a direction in which the coolant flows in the cooling flow path, sectional shapes of the cooling flow path in the direction that is perpendicular to the direction in which the coolant flows differs from each other.

9. A vehicle that travels with rotation of a motor comprising:
a rotor that has a motor shaft disposed along a central axis extending in an axial direction;
a stator that faces the rotor with a gap interposed therebetween in the radial direction;
a battery;
a motor driving inverter unit that supplies electric power from the battery to the stator;
a charger that has a charger inverter unit that charges the battery; and
a housing that accommodates the stator, the motor driving inverter unit, and the charger,
wherein the housing has
a cooling flow path through which a coolant flows,
an inlet port into which the coolant flowing in the cooling flow path flows, and
an outlet port from which the coolant flowing in the cooling flow path flows,
the motor driving inverter unit and the charger inverter unit are disposed in the housing along the cooling flow path, and
the motor driving inverter unit is disposed closer to a side of the inlet port than a position where the charger inverter unit is disposed,
the motor driving inverter unit has a motor driving heat generation element,
the charger inverter unit has a charger heat generation element, and the motor driving heat generation element and the charger heat generation element are disposed along the cooling flow path, and
the motor driving heat generation element is disposed closer to a side of the inlet port side than a position where the charger heat generation element is disposed, and
the motor further comprises:
a condenser that smooths a voltage connected to the battery;
a reactor that smooths the voltage connected to the battery; and
a DC-DC conversion unit that boosts and lowers a voltage between the motor driving inverter unit and the battery,
wherein the DC-DC conversion unit has a DC-DC conversion heat generation element, and
the motor driving heat generation element, the DC-DC conversion heat generation element, the reactor, the condenser, and the charger heat generation element are sequentially disposed along the cooling flow path from an upstream to a downstream of a flow in the cooling flow path.

10. A motor comprising:
a rotor that has a motor shaft disposed along a central axis extending in an axial direction;
a stator that faces the rotor with a gap interposed therebetween in a radial direction;
a motor driving inverter unit that supplies electric power from a battery to the stator;
a charger that has a charger inverter unit for charging the battery;
a plurality of heat generation elements; and
a housing that accommodates the stator, the motor driving inverter unit, and the charger,
wherein the plurality of heat generation elements is fixed to the housing parallel to a specific direction,
the housing comprises:
a cooling flow path through which a coolant flows, and
a plurality of fixing units that fix the plurality of heat generation elements to the housing,
the plurality of heat generation elements comprises:
a first heat generation element, and
a second heat generation element,
the plurality of fixing units comprises:
a first fixing unit that is disposed at one end of the first heat generation element,
a second fixing unit that is disposed at the other end of the first heat generation element, a third fixing unit that is disposed at one end of the second heat generation element, and a fourth fixing unit that is disposed at the other end of the second heat generation element, the second fixing unit is adjacent to the third securing unit, and the cooling flow path is disposed at a location other than a location between the second securing unit and the third securing unit.

11. The motor according to claim 10, wherein the cooling flow path has an orthogonal direction flow path through which the coolant flows in a direction that is perpendicular to the specific direction.

12. The motor according to claim 10, wherein the cooling flow path comprises a plurality of orthogonal direction flow paths through which the coolant flows in a direction that is perpendicular to the specific direction.

13. The motor according to claim 12, wherein the cooling flow path has a plurality of parallel direction flow paths through which the coolant flows in a direction parallel to the specific direction.

14. The motor according to claim 10, wherein the cooling flow path is disposed in a bellows shape with respect to the specific direction.

15. The motor according to claim 10 wherein the first heat generation element is a motor driving heat generation element, the second heat generation element is a charger heat generation element, the motor driving heat generation element and the charger heat generation element are fixed at positions along the cooling flow path, and the position at which the motor driving heat generation element is fixed is closer to an upstream side of a flow of the cooling flow path than the position at which the charger heat generation element is fixed.

16. The motor according to claim 15, wherein the motor driving heat generation element comprises a plurality of switching elements, and the charger heat generation element comprises a plurality of switching elements.

17. The motor according to claim 16, wherein the plurality of switching elements of the motor driving heat generation element and the plurality of switching elements of the charger heat generation element are a plurality of IGBTs.

18. The motor according to claim 10, wherein the housing comprises:

a stator accommodation unit that accommodates the stator, an inverter accommodation that is positioned outside the stator accommodation unit in a radial direction and accommodates the motor driving inverter unit, and a charger accommodation unit that is positioned outside the stator accommodation unit in the radial direction and accommodates the charger, and the housing that has the stator accommodation unit, the inverter accommodation unit, and the charger accommodation unit is a single member.

19. The motor according to claim 10, wherein a sectional area of the cooling flow path in a direction that is perpendicular to a direction in which the coolant flows is constant in the direction in which the coolant flows in the cooling flow path.

* * * * *